(12) United States Patent
Machida et al.

(10) Patent No.: US 7,199,303 B2
(45) Date of Patent: Apr. 3, 2007

(54) OPTICAL ENERGY CONVERSION APPARATUS

(75) Inventors: Akio Machida, Kanagawa (JP); Setsuo Usui, Kanagawa (JP); Kazumasa Nomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/221,719

(22) PCT Filed: Mar. 13, 2001

(86) PCT No.: PCT/JP01/01981

§ 371 (c)(1),
(2), (4) Date: Dec. 19, 2002

(87) PCT Pub. No.: WO01/69690

PCT Pub. Date: Sep. 20, 2001

(65) Prior Publication Data

US 2003/0136440 A1    Jul. 24, 2003

(30) Foreign Application Priority Data

Mar. 13, 2000    (JP)    ............... P2000-067981

(51) Int. Cl.
*H01N 6/00* (2006.01)

(52) U.S. Cl. .............. 136/249; 136/255; 136/258; 136/261; 257/53; 257/65; 257/66; 257/458; 438/96; 438/97

(58) Field of Classification Search ............... 136/249, 136/261, 255, 258; 257/53, 65, 66, 458; 438/96, 97

See application file for complete search history.

(56) References Cited

U.S. PATENT DOCUMENTS 5,210,766 A    5/1993    Winer et al. ............ 257/52

(Continued)

FOREIGN PATENT DOCUMENTS

GB    2030766    4/1980

(Continued)

OTHER PUBLICATIONS

Zellama et al, "Hydrogen-effusion-induced structural changes and defects in a-Si:H films: Dependence upon the film microstructure," Physics Review B, vol. 53, No. 7, Feb. 15, 1996.*

*Primary Examiner*—Arun S. Phasge
(74) *Attorney, Agent, or Firm*—Sonnenschein Nath & Rosenthal LLP

(57) ABSTRACT

An optical energy conversion apparatus 10 includes a first impurity doped semiconductor layer 5, formed on a substrate, and which is of a semiconductor material admixed with a first impurity, an optically active layer 6, formed on the first impurity doped semiconductor layer 5, and which is of a hydrogen-containing amorphous semiconductor material, and a second impurity doped semiconductor layer 7, admixed with a second impurity and formed on the optically active semiconductor layer 6. The second impurity doped semiconductor layer is of a polycrystallized semiconductor material lower in hydrogen concentration than the material of the optically active semiconductor layer 6. The average crystal grain size in the depth-wise direction in an interfacing structure between the optically active semiconductor layer 6 and the second impurity doped semiconductor layer 7 is decreased stepwise in a direction proceeding from the surface of the second impurity doped semiconductor layer towards the substrate 1. By controlling the hydrogen concentration of the second impurity doped semiconductor layer 7, the number of dangling bonds in the second impurity doped semiconductor layer 7 is significantly decreased to exhibit superior crystallinity to improve the conversion efficiency of the apparatus 10.

15 Claims, 13 Drawing Sheets

U.S. PATENT DOCUMENTS

| | | | |
|---|---|---|---|
| 5,346,850 A | 9/1994 | Kaschmitter et al. | |
| 5,677,236 A * | 10/1997 | Saitoh et al. | 438/485 |
| 5,716,480 A | 2/1998 | Matsuyama et al. | |
| 5,769,963 A | 6/1998 | Fujioka et al. | |
| 5,919,316 A * | 7/1999 | Bogorad et al. | 136/256 |

FOREIGN PATENT DOCUMENTS

| | | |
|---|---|---|
| GB | 2030766 A * | 4/1980 |
| JP | 57-045980 | 3/1982 |
| JP | 57-187971 | 11/1982 |
| JP | 59-063774 | 4/1984 |
| JP | 63-160282 | 7/1988 |
| JP | 63258078 | 10/1988 |
| JP | 63-318166 | 12/1988 |
| JP | 1-280365 | 11/1989 |
| JP | 3-159179 | 7/1991 |
| JP | 9-027628 | 1/1997 |
| JP | 9-027629 | 1/1997 |
| JP | 9-027630 | 1/1997 |
| JP | 9-027631 | 1/1997 |
| JP | 9-027632 | 1/1997 |
| JP | 9-069639 | 3/1997 |
| JP | 9-069640 | 3/1997 |

* cited by examiner

OPTICAL ENERGY CONVERSION APPARATUS

TECHNICAL FIELD

This invention relates to an optical energy conversion apparatus and a method for the preparation thereof. More particularly, it relates to an optical energy conversion apparatus and a method for the preparation thereof according to which the apparatus can be reduced in thickness and improved in the conversion efficiency so that the apparatus can be applied to a solar cell device or a photosensor.

BACKGROUND OF THE INVENTION

As a technique for converting a pre-set energy source to an electrical energy and for capturing the so-converted electrical energy, thermal power generation and nuclear power generation are being routinely used. In the thermal power generation, fossil fuels, such as coal or petroleum, is combusted to generate an energy which is converted through a mechanical energy into an electrical energy. In nuclear power station, a nuclear fuel is used to produce a nuclear fission and the nuclear energy so produced is converted into an electrical energy.

However, in thermal power generation, such problems as global warming due to carbon dioxide generated on combusting the fossil fuel are presented. On the other hand, the nuclear power generation is accompanied perpetually by a problem such as environmental pollution by radioactivity emitted in the reaction of nuclear fission and adverse effects on the human health.

That is, if the electrical energy is to be obtained by exploiting the above-described power generation technique, there is accompanied the effect on the environment, with the consequence that sustained dependence on the fossil fuel and on the nuclear energy poses a serious problem.

Meanwhile, a solar cell, as a photoelectric conversion device for converting the solar light into an electrical energy, has the solar light as an energy source, so that it has less adverse effect on the global environment, so that it is expected to be used extensively as future power generating device.

First, the efficiency of the solar cell, retained to be promising as next-generation power generating device, is explained with reference to FIG. 1. The solar cell is a device for converting the incident optical energy into an electrical energy. In the current technical level, a major part of the incident optical energy is lost in the course of the conversion process of the light energy to the electrical energy, and of extracting the electrical energy. Among the losses of the light energy incident on the solar cell, there are quantum loss, loss due to carrier recombination, surface reflection loss, absorption by the doping layer and loss due to serial resistance.

The ratio of the optical energy incident on the solar cell to the utilizable electrical energy corresponding to the incident optical energy minus the above losses is termed the effective efficiency of the solar cell. It is a general task in the preparation of the solar cell how to raise the effective efficiency of the solar cell.

Meanwhile, the basic structure of the solar cell is a diode having a cathode and an anode in a junction of p-and n-type semiconductors. If light falls on this semiconductor, an electron-positive hole pair is generated per photon in a level higher than the band gap proper to the semiconductor. The electron and the positive hole are isolated from each other by an electrical field of the pn junction and are drawn to the n-type semiconductor and to the p-type semiconductor, respectively, so that an electrical voltage (photo-electromotive force) is produced across both electrodes. If the cathode and the anode are connected to each other, an electrical power is produced.

Apart from the above-mentioned p-n type solar cell, having the pn junction, there is also a p-i-n type structure comprised of an i-layer of an intrinsic semiconductor area sandwiched between p-type and n-type semiconductor layers. The solar cell having the p-i-n type structure is wider in breadth than the p-type semiconductor layer or the n-type semiconductor layer. By the i-layer operating as a depletion area, the solar cell having the p-i-n type structure is able to absorb incident photons on the solar cell to generate as many electron-positive pole pairs as possible, as well as to make the light response faster. The above-mentioned i-layer becomes an optically active layer of the p-i-n type solar cell.

FIG. 2 shows an energy band diagram in case of short-circuiting the terminals of the p-i-n type solar cell. The Fermi level Ef in the p-type semiconductor layer is slightly above an upper end of the valence electron band, with the positive holes being majority carriers and with the electrons being the minority carriers. On the other hand, the Fermi level Ef in the n-type semiconductor layer is slightly below the conduction band, with the electrons being majority carriers and with the positive holes being the minority carriers. The i-layer, which is a junction of the p-type semiconductor layer and the n-type semiconductor layer, forms a potential barrier.

The material which constitutes the solar cell is generally silicon. The solar cell formed of silicon is roughly classified into a crystalline solar cell, formed of a single crystal solar cell or a polycrystalline silicon, and an amorphous silicon solar cell.

The crystalline silicon solar cell, which has so far been mainstream, is high lower at the current technical level than the amorphous silicon solar cell, suffers from the problem that, since crystal growth process is energy- and time-consuming, the solar cell is difficult to mass-produce, while being high in production cost.

Conversely, the amorphous silicon solar cell is lower in conversion efficiency in the current technical level than the crystalline silicon solar cell, however, it is higher in optical absorption, such that the thickness of the solar cell required for photoelectric conversion may be 1/100 of that of the crystalline silicon solar cell, and hence the solar cell can be constructed by depositing a layer of a thinner thickness. Moreover, the substrate material of the amorphous silicon solar cell may be selected from a wide variety of materials, such as glass, stainless steel, or polyimide-based plastic films, such that the amorphous silicon solar cell has such merits that it is broader in manufacturing tolerance and can be of an increased area. In addition, since the amorphous silicon solar cell can be reduced in production cost than the crystalline silicon solar cell, it is expected to be used in future in a wide range of fields of application from domestic use to a large-scale power generation plants.

The solar cell, as the smallest unit of the amorphous silicon solar cell can be prepared, as a result of development of the CVD (chemical vapor deposition) technique, by sequentially depositing semiconductor thin films having any desired composition or thickness. In general, a thin film of a phosphorus-containing n-type amorphous silicon, which is abbreviated below to a-Si:H, an impurity-free i-type a-Si:H thin film and a boron-containing p-type a-Si—H film are sequentially deposited on a substrate, such as glass substrate, to form a solar cell. This solar cell has a potential gradient from its surface receiving the incident light towards its back surface. It should be noted that a-Si:H is a hydrogenated amorphous silicon thin film into which hydrogen has been captured in forming the silicon thin film. By having hydrogen captured into the amorphous silicon, the light absorption coefficient in the visible light area can be increased to increase the light absorption coefficient in the visible light range. The conversion efficiency of the solar cell can be improved by employing this sort of the material as the battery material.

However, if the above-mentioned a-Si:H only is used in preparing the solar cell, the light having the wavelength not less than 800 nm can scarcely be used because the band gap of a-Si:H is on the order of 1.75 eV.

Thus, such a solar cell has been proposed in which the potential gradient is produced by impurities and two or more semiconductor materials having different band gaps are deposited in superposition to provide for efficient photoelectric conversion of the light beams of different wavelengths.

The solar cell having the above-described structure, termed a hetero junction type cell, has been proposed in view of the fact that the cell cannot photo-electrically convert the light lower in energy than the band gap of the semiconductor material forming the solar cell, and that the larger the band gap of the semiconductor material, the higher is the voltage that can be obtained by photoelectric conversion. With the hetero junction type solar cell, the photoelectric conversion efficiency is improved by providing plural semiconductor layers having band gaps corresponding to the incident light energy.

The hetero junction type solar cell aims at realizing effective light utilization by employing e.g., amorphous silicon germanium, termed below a-SiGe:H. However, this a-SiGe:H has a drawback that, although it exhibits more significant absorption to the light of longer wavelength and hence it is able to enlarge the shorting current, it exhibits an in-gap level formed in the gap higher than that with a-Si:H to decrease a curve factor to lower the conversion efficiency.

This problem is addressed by varying the composition of a-SiGe:H and a-Si:H to thereby vary the band gap continuously.

With this method, the closer the minimum value portion of the band gap of the i-layer to the p-type semiconductor layer as the light incident side, the optical deterioration may be lowered to improve the device reliability. This is due to the fact that the larger the distribution of the optical absorption in the vicinity of the p-type semiconductor layer, the higher becomes the degree of collection of the positive holes. However, there is raised a problem that, if the smallest value portion of the band gap is formed in the vicinity of the p-type semiconductor layer, the band gap of the i-layer in the vicinity of the p-type semiconductor layer becomes smaller to decrease the voltage value further. In addition, in this method, in which the band gap of the i-layer is decreased to increase optical absorption, the curve factor is increased with the band gap of the i-layer approximately 1.4 eV or less, thus imposing limitations in improving the conversion efficiency despite increased light optical absorption.

There is also proposed a method of providing an amorphous silicon carbide (a-SiC:H) layer, having a wide gap on the order of 2.1 eV, in an interface between the p-type semiconductor layer and the i-layer. However, this method suffers a problem that, since it is not possible to form an a-SiC:H layer of a high film quality, the optical deterioration, which may lead to the worsened hole movement following light irradiation, tends to be increased.

Meanwhile, in order to accommodate the solar cell to various usages, it is necessary to respond to the demand for achieving the lightness in the weight of the product, improved productivity, ease in machining the curved surfaces and for cost reduction.

The majority of the low melting materials or plastic materials can be molded to a desired shape at lower temperatures, so that machining costs can be advantageously decreased. Moreover, a plastics material has a merit that it is lightweight and less liable to cracking. Therefore, it is desirable to use the low melting material or plastics material as a substrate of the solar cell. If the plastic material, especially a general-purpose plastics, such as polyester film, as a substrate, it becomes possible to improve the productivity significantly using a roll-to-roll type manufacturing system employing an elongated substrate.

However, since the heat resisting temperature of the general-purpose plastics is generally 200° C. or lower, it is necessary to use a low-temperature film forming process and to realize film formation to a high film quality in the low-temperature film forming process.

If such materials as Si, $Si_{1-x}Ge_x$, Ge or $Si_{1-x}C_x$ are subjected to a film-forming process at a substrate temperature of 200° C. or lower, the resulting film is usually amorphous. In the amorphous film, there exist a large number of elements, which serve as nuclei of re-combination of minority carriers, such as local energy level in the energy band gap, with the carrier length being shorter than that in a single-crystal film or a polycrystalline film.

Therefore, if an a-Si:H film, an $a-Si_{1-x}Ge_x$:H film, an a-Ge:H film or an $a-Si_{1-x}C_x$:H film, doped with an impurity, such as a film which has become a p- or n-type semiconductor layer on being doped with boron or phosphorus, is used as the p-type semiconductor layer and/or as the n-type semiconductor layer in the p-i-n type solar cell, the conversion efficiency is lowered due to the lower dark current ratio, thus proving a hindrance to the preparation of a high quality solar cell at lower temperatures. Therefore, if these materials are used, the dark current ratio must needs be $1\times10^{-3}$ S/cm or less and moreover is required to be not less than $1\times10^{-2}$ S/cm.

Moreover, in the p-i-n type solar cell, light absorption in the p-type semiconductor layer or in the n-type semiconductor layer does not contribute to improvement in the efficiency (so-called dead zone). The $a-Si_{1-x}Ge_x$:H film, an a-Ge:H film or an $a-Si_{1-x}C_x$:H film, doped with an impurity, is insufficient in the doping efficiency, so that the film tends to be depleted. If the $a-Si_{1-x}Ge_x$:H film, an a-Ge:H film or an $a-Si_{1-x}C_x$:H film is used, the film thickness needs to be thicker to a more or less extent to prevent the depletion. So, with this sort of the solar cell, in which the p-type semiconductor layer or the n-type semiconductor layer is increased in film thickness, the light absorption in these layers is increased to obstruct the improvement in the conversion efficiency.

Thus, in the p-i-n type amorphous silicon based solar cell, such a technique has been proposed in which only the p-type semiconductor layer doped with an impurity and the i-layer are crystallized to decrease the value of the light absorption coefficient as an index for ease in optical absorption to improve the conversion efficiency.

For example, in the Japanese Patent Publication H-6-5780, the p-type semiconductor layer and the n-type semiconductor layer of the hydrogenated amorphous silicon are irradiated with an excimer laser, whereas, in the Japanese Laying-Open Publication S-63-133578, the p-type semiconductor layer and the n-type semiconductor layer of the hydrogenated amorphous silicon are irradiated with the YAG-laser for annealing, thereby crystallizing the p-type semiconductor layer and the n-type semiconductor layer.

However, should the laser of an energy strength sufficient to crystallize the hydrogenated amorphous silicon be directly radiated on the film surface, the a-Si:H film is flown off under the pressure of precipitous hydrogen extraction from within the film, whilst hydrogen passivated below the poly-Si layer is also extracted to produce films of inferior optical properties having a large number of dangling bonds. FIG. 3 shows the state of the hydrogenated amorphous silicon film before and after irradiation of the excimer laser (ELA) of the aforementioned intensity.

It may be seen from FIG. 3 that hydrogen is ejected from within the hydrogenated amorphous silicon film as a result of laser irradiation. Should hydrogen be ejected from within the film, the film is destroyed.

In particular, in a film prepared at lower temperatures, there are many cases where a large quantity of hydrogen is contained between Si networks. In order to evade ablation resulting from sudden warming and resulting explosion of hydrogen, the operation of so-called hydrogen extraction by raising the temperature to approximately 400° C. in a furnace is required. FIG. 4 shows the manner in which a film is crystallized by irradiating excimer laser (ELA) on the film from which hydrogen is extracted as described above.

Should only the doping layer of the hydrogenated amorphous silicon be crystallized by annealing on laser irradiation, it is not possible to form a p-i-n type solar cell having a doping polycrystalline film of higher quality having only a smaller number of dangling bonds.

SUMMARY OF THE INVENTION

It is therefore an object of the present invention to provide an optical energy conversion apparatus of a thin type having a high conversion efficiency, and a method for the preparation thereof.

In one aspect, the present invention provides an optical energy conversion apparatus including a first impurity doped semiconductor layer, formed on a substrate, the first impurity doped semiconductor layer being of a semiconductor material admixed with a first impurity, an optically active layer, formed on the first impurity doped semiconductor layer, the optically active semiconductor layer being of a hydrogen-containing amorphous semiconductor material, and a second impurity doped semiconductor layer, admixed with a second impurity and formed on the optically active semiconductor layer, the second impurity doped semiconductor layer being of a polycrystallized semiconductor material lower in hydrogen concentration than the material of the optically active semiconductor layer. The average crystal grain size of the second impurity doped semiconductor layer is decreased stepwise in a direction proceeding from the surface of the second impurity doped semiconductor layer towards the substrate.

In this optical energy conversion apparatus, micro-crystals are formed in the second impurity doped semiconductor layer so that the average crystal grain size will be decreased from the surface of the second impurity doped semiconductor layer towards the substrate.

In another aspect, the present invention provides a method for the preparation of an optical energy conversion apparatus forming a first impurity doped semiconductor layer on a substrate, the first impurity doped semiconductor layer being of a hydrogen-containing amorphous semiconductor material, forming an optically active layer on the first impurity doped semiconductor layer, the optically active layer being of a hydrogen-containing amorphous semiconductor material, forming a second impurity doped semiconductor layer on the optically active layer, the second impurity doped semiconductor layer being of an amorphous semiconductor material which is admixed with a second impurity and which is lower in hydrogen concentration than the optically active layer, and irradiating laser light on the substrate after forming the second impurity doped semiconductor layer for laser annealing.

In a method for the preparation of an optical energy conversion apparatus, after forming the second impurity doped semiconductor layer which is lower in hydrogen concentration than the optically active layer, irradiating laser light on the second impurity doped semiconductor layer formed for laser annealing, and crystallizing the second impurity doped semiconductor layer.

DETAILED DESCRIPTION OF THE PRESENTLY PREFERRED EMBODIMENTS

Figure 1:
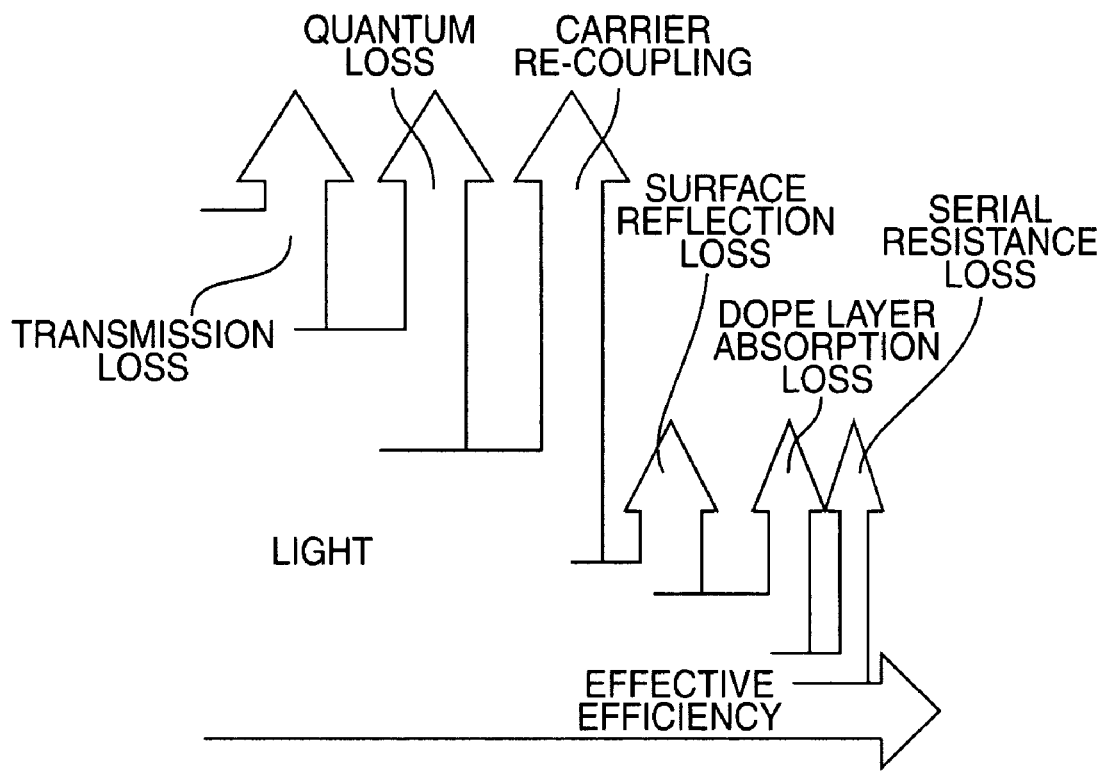
FIG. 1 illustrates the efficiency of a solar cell
Figure 2:
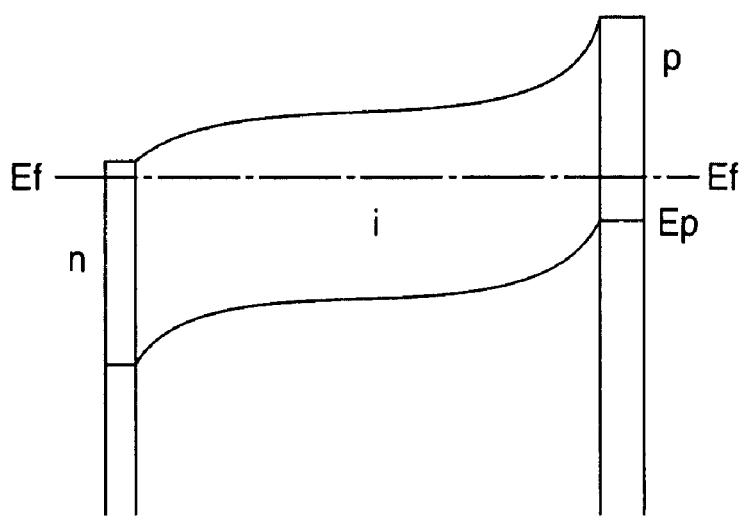
FIG. 2 illustrates a band diagram of a p-i-n type solar cell.
Figure 3:
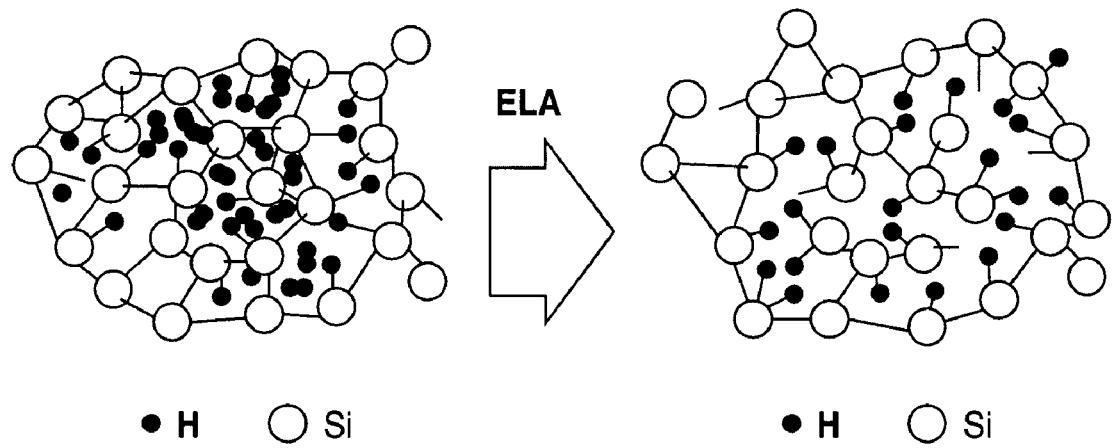
FIG. 3 illustrates the manner in which a film is destroyed by hydrogen on irradiation of excimer laser.
Figure 4:
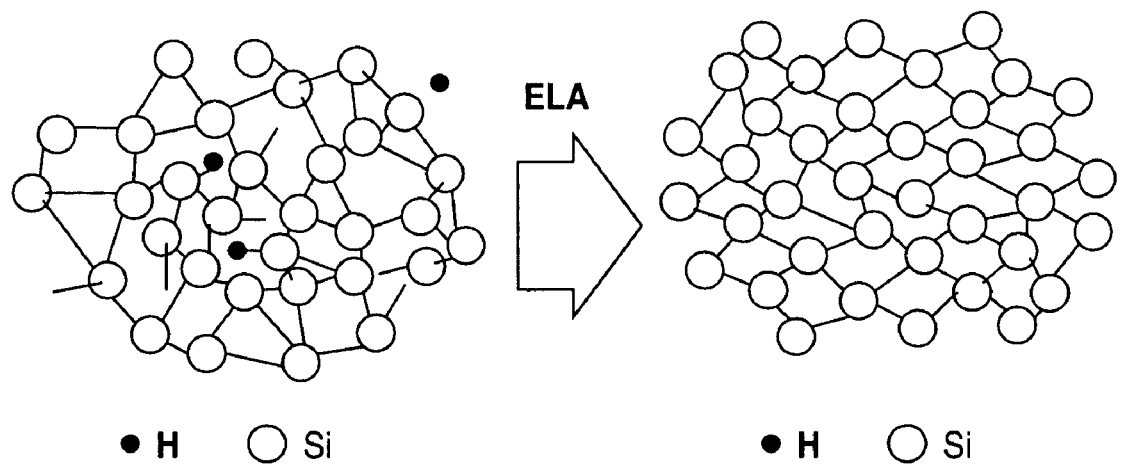
FIG. 4 illustrates the manner in which a film is cristallized on irradiation of excimer laser without being destroyed by hydrogen.

Referring to the drawings, the best mode of carrying out the present invention will be explained in detail.

A solar cell 10 embodying the present invention is hereinafter explained. The solar cell 10 is shown in cross-section in FIG. 5.

The solar cell 10 includes a plastics substrate 1. Among the materials of the plastics substrate, there are, for example, polyesters, such as polyethylene terephthalate, polyethylene naphthalate, or polycarbonates, polyesters, such as polypropylene, polyolefins, such as polypropylene, polyphenylene sulfides, such as polypropylene sulfide, polyamides, aromatic polyamides, polyether ketones, piolyimides, acrylic resins, and PMMA. In particular, general-purpose plastics, such as polyethylene terephthalate, acetate, polyphenylene sulfides, plycarbonates, polyether sulphone, polystyrene, nylon, polypropylene. polyvinyl chloride, acrylic resins and PMMA, are preferred. If film-shaped pasticssubstrate is used, the plastics material is preferably bi-axially stretched in view of mechanical stability and strength.

On the plastics substrate 1 is formed an electrode layer 2 using a sputtering device. The electrode layer 2 is a transparent electrically conductive film or a metal electrode.

As a transparent electrically conductive film, oxides of high transparency and low resistance, such as ITO, tin oxide, fluorine-doped tin oxide, zinc oxide-aluminum oxide, are used. If ITO is used, the doping quantity of tin oxide is preferably 2 to 20 wt %.

The metals of the metal electrodes may, for example, be Ag, Cr, Mo, Ta or Al.

Between the electrode layer 2 and the plastics substrate 1, there is preferably provided an adhesive layer 3 for improving the adhesion of the electrode layer 2 and the plastics substrate 1 to each other. As the adhesive forming the adhesive layer 3, an acrylic adhesive, a silicone-based adhesive or an EVA resin based adhesive is preferred.

The electrode layer 2 may be of a laminated structure comprised of transparent electrically conductive films and metal electrodes, such as a laminated structure comprised of ZnO/Al, ZnO/Ag, ZnO/Cr, ITO/Al, ITO/Ag or ITO/Cr. With the layered structure of the transparent electrically conductive films and metal electrodes, the electrode layer 2 prohibits metal diffusion to achieve a high electrical conductiveity.

On the back surface of the plastics substrate 1, that is on the surface of the plastics substrate 1 opposite to its surface carrying the electrode layer 2, there may be formed a back surface barrier layer, not shown. This back surface barrier layer is able to suppress moisture absorption of the plastics substrate 1, thus preventing the plastics substrate 1 from becoming deformed as when the solar cell 10 is exposed to atmospheric pressure from the vacuum vessel of the sputtering device or during the solar cell manufacturing process. This back surface barrier layer may be formed of silicon oxide.

A barrier layer 4 may also be formed between the plastics substrate 1 and the electrode layer 2. Similarly to the back surface barrier layer, the barrier layer 4 may be formed of silicon oxide. The barrier layer 4 in such case operaters as a protective layer.

On the upper surface of the electrode layer 2, pre-set impurities are doped to form Si-based amorphphous films, such as a-Si:H film, an a-Si$_{1-x}$Ge$_x$:H film, an a-Ge:H film or an a-Si$_{1-x}$C$_x$:H film. As the film forming device, a sputtering device is used. In film forming, the substrate temperature is set to not higher than 200° C. for whichthe plastics substrate is not likely to be damaged, preferably to not higher than 150° C.

The Si-based amorphous film, deposited on the upper surface of the electrode layer 2, is polycrystallized, using an excimer laser (ELA) to form microcrystals to form a doping layer 5 of, for example, poly-Si, poly-Si$_{1-x}$Ge$_{1-x}$, poly-Ge or poly-Si$_{1-x}$C$_x$.

As the excimer laser, ArF excimer laser, XeF excimer laser, XeCl excimer laser or KrF excimer laser, for example, is used. The irradiation energy and the irradiation time of the excimer laser are selected so that the temperature of the plastics substrate will be maintained at 200° C. or lower and preferably at 150° C. or lower. By adjusting the energy of the excimer laser irradiated, it is possible to produce a film extremely thin in thickness and which is higher in the doping efficiency.

It has been ascertained that the crystallization factor of a film is varied with the energy of the excimer laser irradiated, such that, if the film is not completely crystallized but is micro-crystallized, there are numerous dangling bonds generated in the film, however, when the hydrogenated film is subsequently formed, there occurs passivation so that the film is turned into a hydrogenated micro-crystallized film (Japanese patent Application H-11-334978, filed on Nov. 25, 1999, by Akio Machida, Gosign D. P., Takashi Noguchi and Setsuo Usui).

Then, an amorphous layer 6, which may be an a-Si:H film, an a-Si$_{1-x}$Ge$_x$:H film, an a-Ge:H film or an a-Si$_{1-x}$C$_x$:H film, or a layered film thereof, is formed using a PE-CVD device or a sputtering device. If the doping film 5 is low in the crystallization factor such that the doping film 5 is micro-crystallized, the amorphous layer 6 is formed, at the same time as the doping film 5 is hydrogenated.

On the upper surface of the amorphous layer 6, an Si-based amorphous film, such as a-Si:H film, an a-Si$_{1-x}$Ge$_x$:H film, an a-Ge:H film or an a-Si$_{1-x}$C$_x$:H film, having a hydrogen concentration lower than that of the amorphous layer 6, and which is doped with a pre-set impurity, or an Si-based amorphous film free of hydrogen, such as a-Si film, an a-Si$_{1-x}$Ge$_x$ film, an a-Ge film or an a-Si$_{1-x}$C$_x$ film, is formed using a sputtering device.

The Si-based amorphous film, formed on an upper surface of the amorphous layer 6, is crystallized, using an excimer laser, to form a doping layer 7, such as poly-Si, poly-Si$_{1-x}$Ge$_x$, poly-Ge or poly-Si$_{1-x}$C$_x$.

By forming the doping layer 7 in such a manner that the hydrogen concentration of the doping layer 7 is lower than that of the amorphous layer 6 or in such a manner that hydrogen content is nil, the doping layer 7 can be formed without being damaged by residual hydrogen at the time of crystallization on irradiation with the excimer laser.

Figure 5:
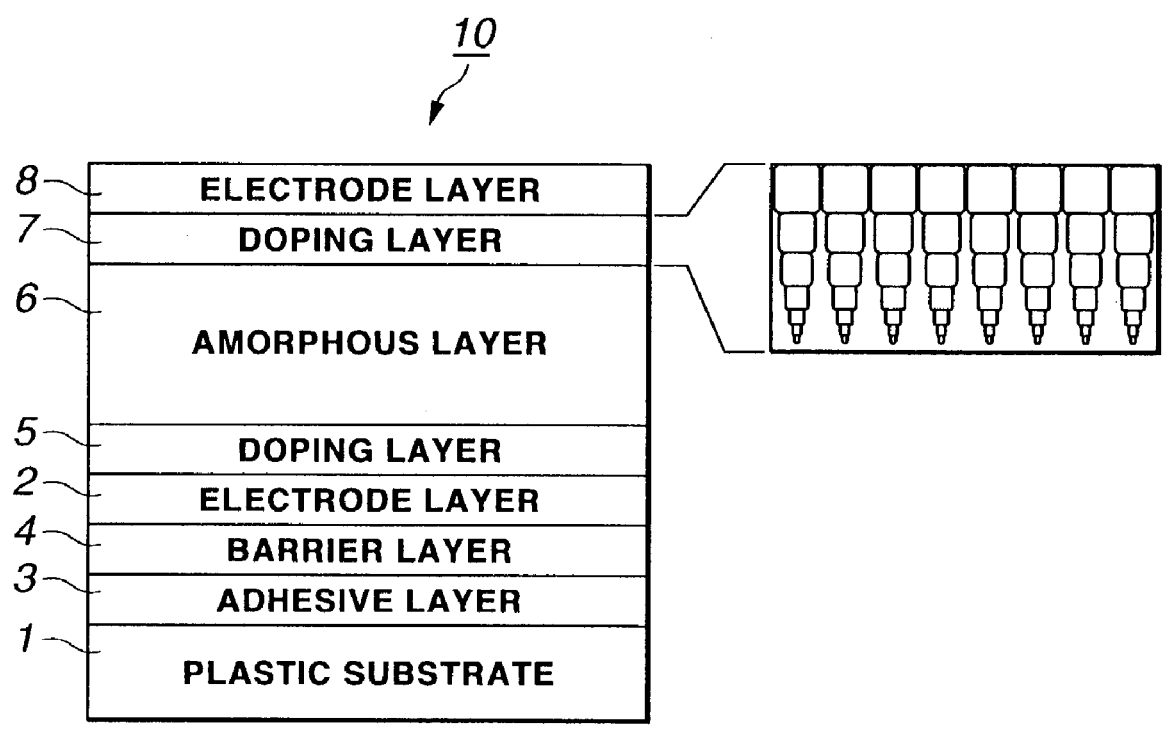
FIG. 5 is a cross-sectional view for illustrating the structure of a solar cell embodying the present invention.

As shown in FIG. 5, the doping layer 7 is globally crystallized, as a result of irradiation with the excimer laser, so that the doping layer 7 becomes a polycrystalline layer in which the average crystal size of the crystals is decreased stepwise in a direction from the surface towards the plastics substrate 1.

The polycrystalline layer, crystallized by the laser light, is formed due to passivation with residual hydrogen slightly extracted from the a-Si:H layer of the amorphous layer 6. So, the doping layer 7 has satisfactory optical properties having only a small number of dangling bonds.

Meanwhile, it is well-known that the hydrogen concentration in the amorphous silicon film in general affects the properties of the amorphous silicon film significantly (for example, Paulo V. Santos and Warren B. Jackson; Physical Review B, 46, 1992, p. 4595), and that an amorphous silicon film having satisfactory properties may be obtained for the hydrogen concentration of 1 to 30% ($5 \times 10^{20}$ atom/cc to $1.5 \times 10^{22}$ atom/cc) or, preferably, of 5 to 25% ($2.5 \times 10^{21}$ atom/cc to $1.25 \times 10^{22}$ atom/cc) (see K. Zellama, L. Chahed, P. Sladek, M. L. Theye, J. H. von Baradeleben and P. Rocai Cabrrocas; Physical Review B, 53, 1996, p. 3804).

If, for a micro-crystal layer, with a crystal size of 1 nm, the volume take-up ratio of crystals (crystallization ratio) of crystals is approximately 80%, the density of crystalline silicon is $5 \times 10^{22}$ (1/cm$^3$), a micro-crystalline layer with an amorphous domain with the hydrogen concentration of approximately 5% is supposed to exist therearound, and pre-set calculations are made, it is seen theoretically that if the microcrystalline interface is completely passivated and hydrogen with the hydrogen concentration of the order of 5% exists in the amorphous domain, provided that there exists hydrogen on the order of $6.3 \times 10^{20}$ ($1/cm^3$). Therefore, if the characteristics of the micro-crystalline domain are taken into account, it is desirable that the amorphous layer 6 contains hydrogen on the order at least of $5 \times 10^{20}$ atom/cc even after irradiation with the energy beam of the excimer laser.

Therefore, the hydrogen concentration of the doping layer 7 needs to be lower than that in the amorphous layer 6 and hence is set to $5 \times 10^{20}$ atom/cc or less.

On the upper surface of the doping layer 7 is formed an electrode layer 8, which is a transparent electrically conductive film. As the transparent electrically conductive film, oxides of high transparency and low electrical resistance, such as ITO, tin oxide, fluorine-doped tin oxide, zinc oxide-aluminum oxide, are used. If ITO is used, the doping quantity of 2 to 20 wt/% is desirable.

In this manner, the solar cell 10 comprised of a layered structure is fabricated. At this time, the doping layer 7 is poly-crystallized, with the crystal grain size becoming smaller stepwise from the surface of the doping layer 7 towards the plastics substrate 1. As this doping layer 7, other Si-based semiconductor films, such as $a-Si_{1-x}O_x$, $a-Si_{1-x}N_x$, SiAl, SiGa, SiS or SiSn, may also be used.

With the solar cell 10, prepared as described above, such a crystalline film having a high doping efficiency can be achieved without thermally damaging the plastics substrate 1. The result is that, since the doping layers 5 and 7 of the solar cell 10 exhibit high electrical conductivity, the Fermi level can be approached to the valence band or to the conduction band, with the doping layer of the p-type semiconductor layer or the n-type semiconductor layer, respectively, thus improving the conversion efficiency.

On the other hand, with the film crystallized with the laser, such a film having a high doping efficiency may be produced in contradistinction from the film obtained with the conventional method consisting in checking for the hydrogen quantity at the time of film formation and forming the film only gradually, so that it is possible to maintain the gradient of the potential from the light receiving surface to the back surface with a p-type semiconductor layer and an n-type semiconductor layer of thinner thicknesses to improve the crystallinity of SiC which is difficult to crystallize with the prior-art system.

The fact that the conversion efficiency can be improved by preparing the solar cell 10 can be confirmed by simulation calculations.

Figure 6:
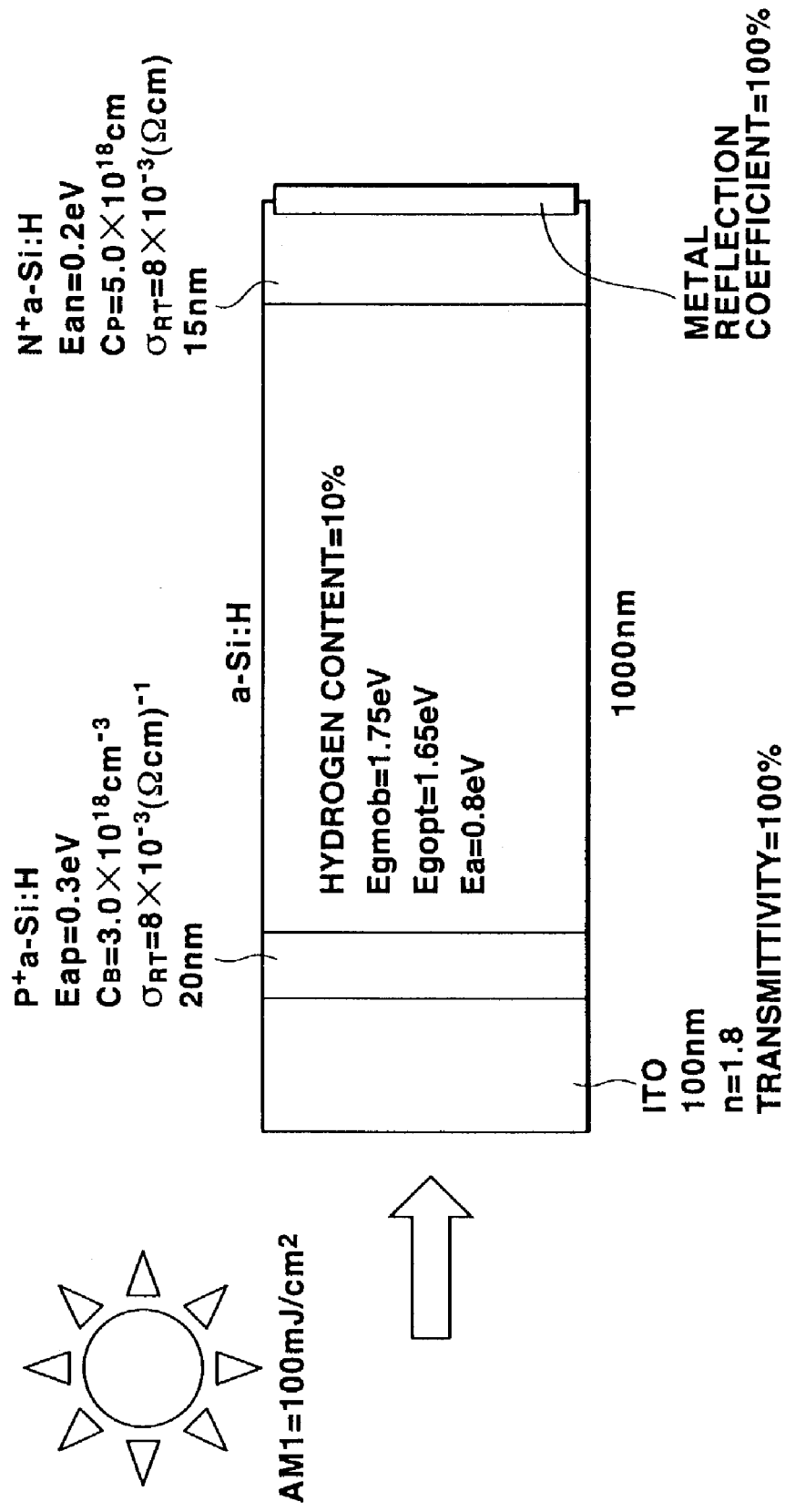
FIG. 6 illustrates a first solar cell model used in simulation calculations for the conversion efficiency.
Figure 7:
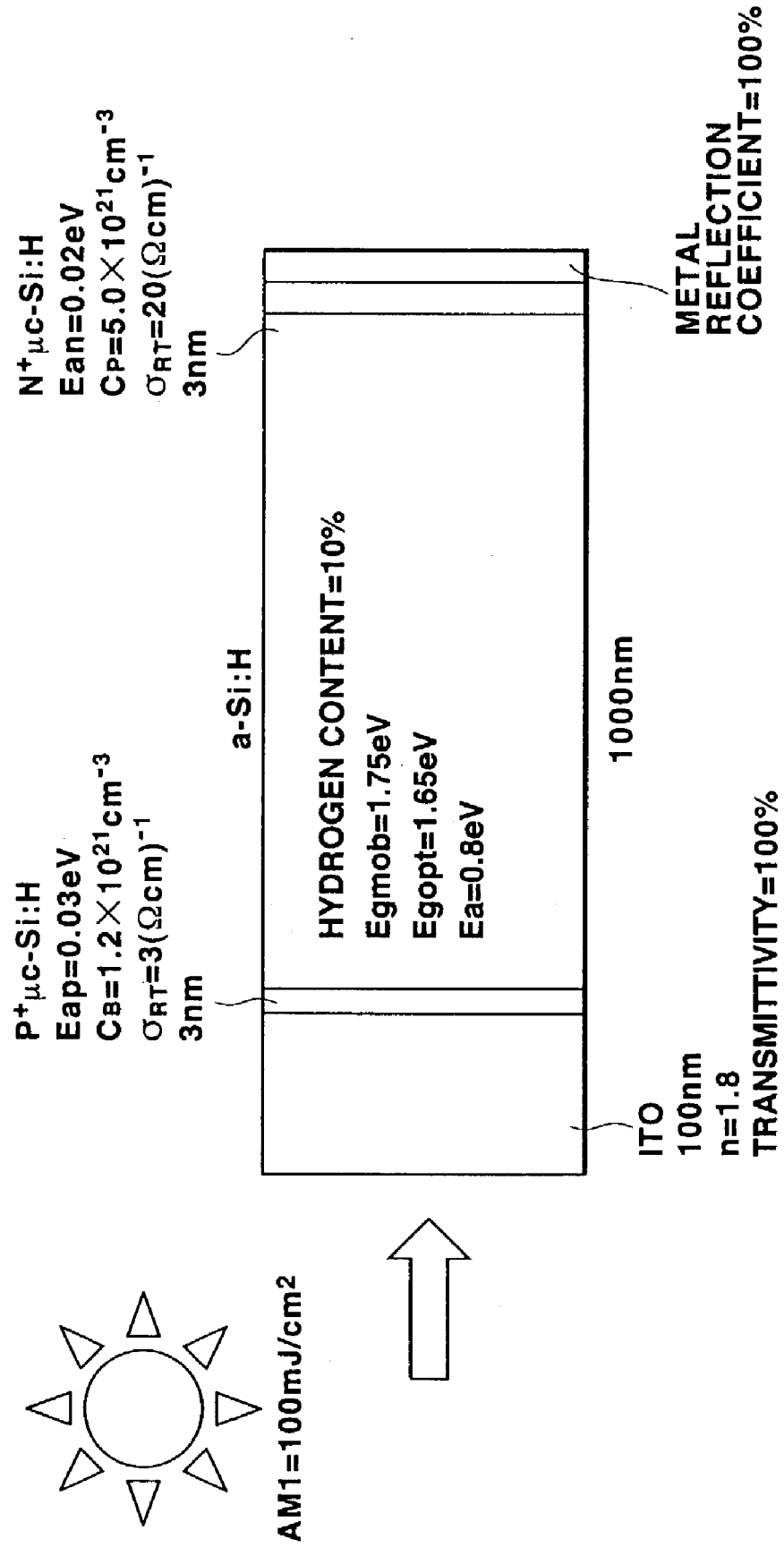
FIG. 7 illustrates a second solar cell model used in simulation calculations for the conversion efficiency.
Figure 8:
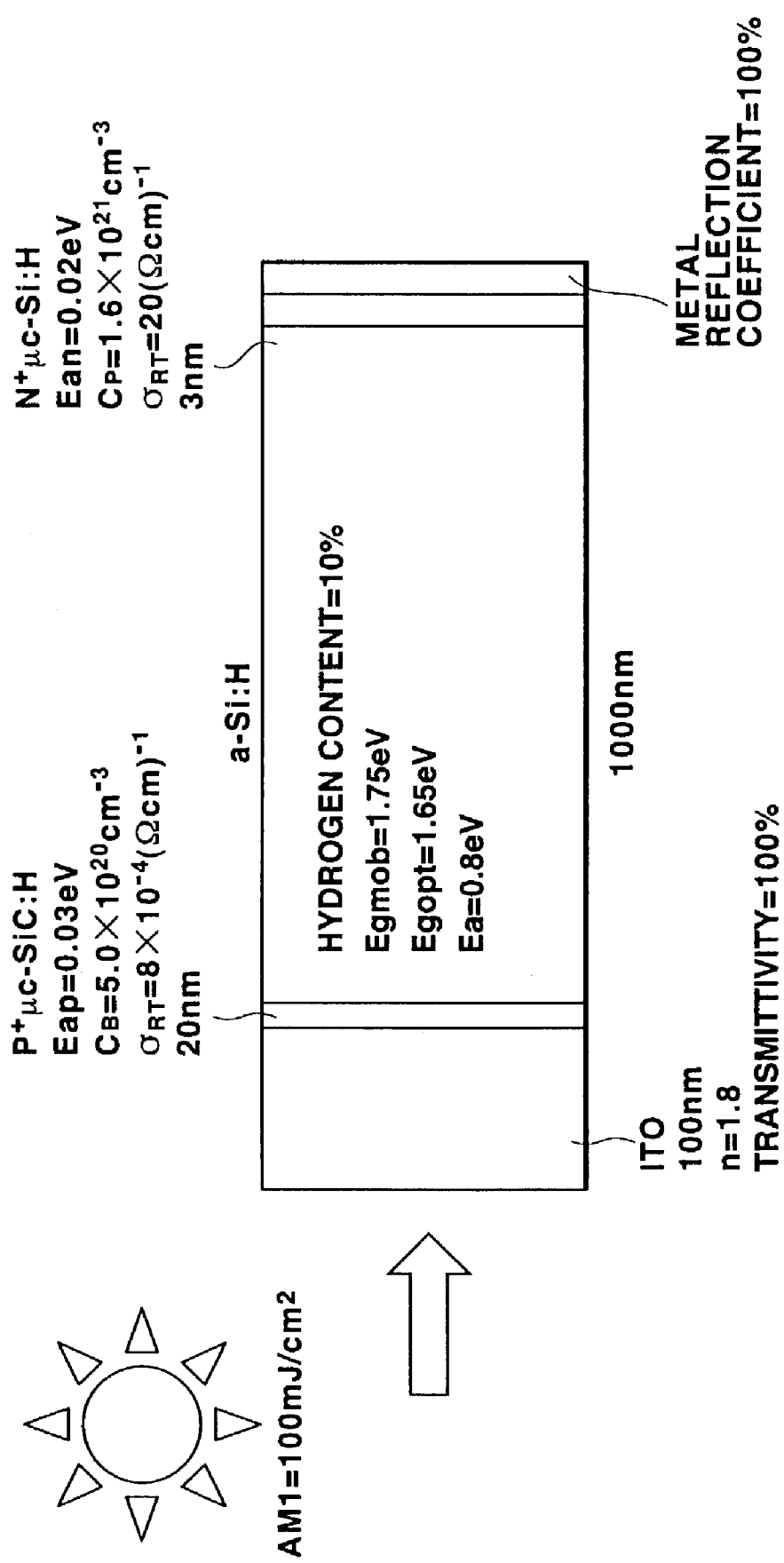
FIG. 8 illustrates a third solar cell model used in simulation calculations for the conversion efficiency.

For example, the simulation calculations of the conversion efficiency can be made using a solar cell model configured as shown in FIGS. 6 to 8.

The solar cell model, shown in FIG. 6, is such a model having a structure of $p^+$a-Si:H/a-Si:H/$n^+$a-Si:H, and which is formed in its entirety by an amorphous silicon film.

The solar cell model, shown in FIG. 7, is such a model having a structure of $p^+\mu c$-Si:H/a-Si:H/$n^+\mu c$-Si:H, and in which the p- and n-type semiconductor layers, as doping layers, are micro-crystallized.

The solar cell model, shown in FIG. 8, is such a model having a structure of $p^+\mu c$-SiC:H/a-Si:H/$n^+\mu c$-Si:H, and in which the p- and n-type semiconductor layers, as doping layers, are micro-crystallized.

In making the simulation calculations, it was presumed that the solar light of AM1.0 was irradiated from the p-type semiconductor layer based on the method of calculations by Nakamura et al. (Nakamura et al.; Proc. 4th EC PVSEC, Stresa, May 10–14, 1982). The absorption coefficient of the micro-crystallized film was calculated based on the absorption coefficient of the crystalline silicon.

Figure 9:
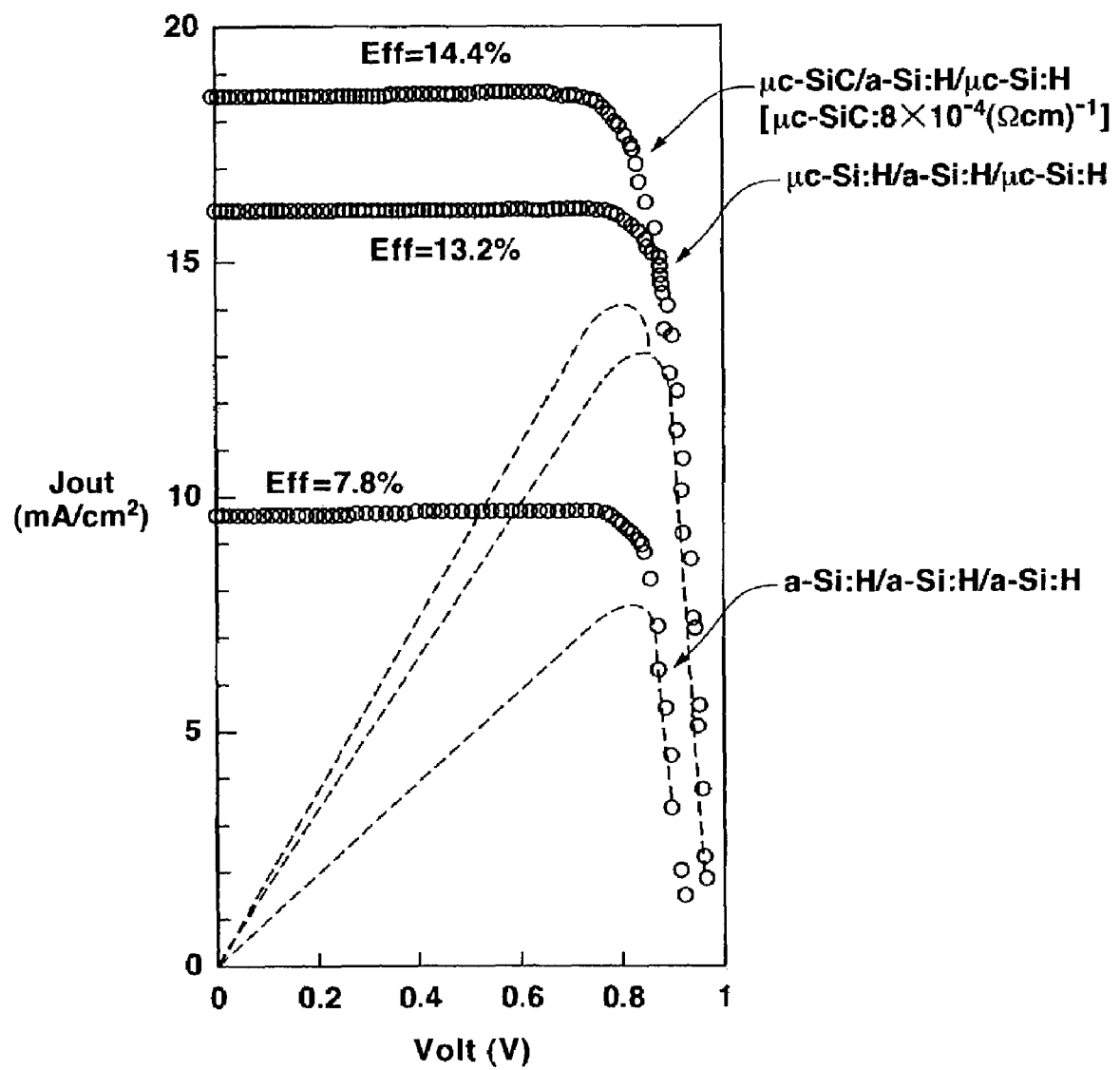
FIG. 9 is a graph showing the results of simulation calculationsd for the conversion efficiency employing a solar cell model.

FIG. 9 shows the results of simulation calculations. It may be seen from FIG. 9 that the conversion efficiency Eff of a solar cell model, having the structure of $p^+$a-Si:H/a-Si:H/$n^+$a-Si:H, is 7.8%, while that of a solar cell model, having the structure of $p^+\mu c$-Si:H/a-Si:H/$n^+\mu c$-Si:H, is 13.2%. It may thus be seen that the conversion efficiency of the solar cell model, in which the p-type and n-type semiconductor layers are micro-crystallized, is higher by a factor of approximately 1.7 than that of the solar cell model, in which the p-type and n-type semiconductor layers and the i-layer are micro-crystallized.

On the other hand, the conversion efficiency Eff of a solar cell model, in which the p-type semiconductor layer is formed of SiC and in which the p-type and n-type semiconductor layers are micro-crystallized, is 14.4%, which is higher by a factor of approximately 1.8 than that of the solar cell model, in which the p-type and n-type semiconductor layers and the i-layer are micro-crystallized.

It should be noted that Nakamura et al., proved the above for the solar cell having the above-described hetero junction type structure by the same calculation method, and that the conversion efficiency can be further improved by combining the hetero type solar cell with the doping layer of the present invention.

Figure 10:
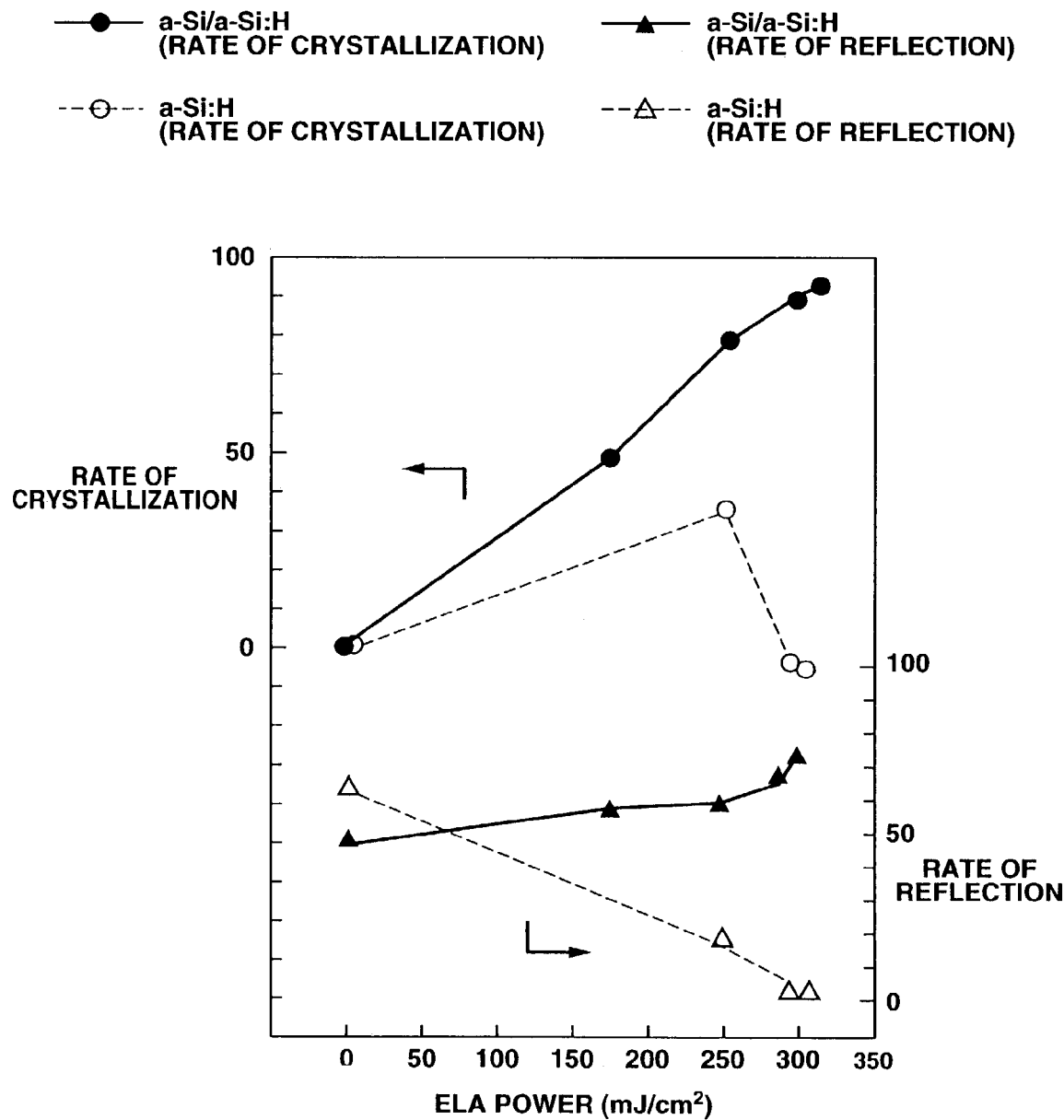
FIG. 10 is a graph showing the results of measurement of the UV reflection of a solar cell embodying the present invention.
Figure 11:
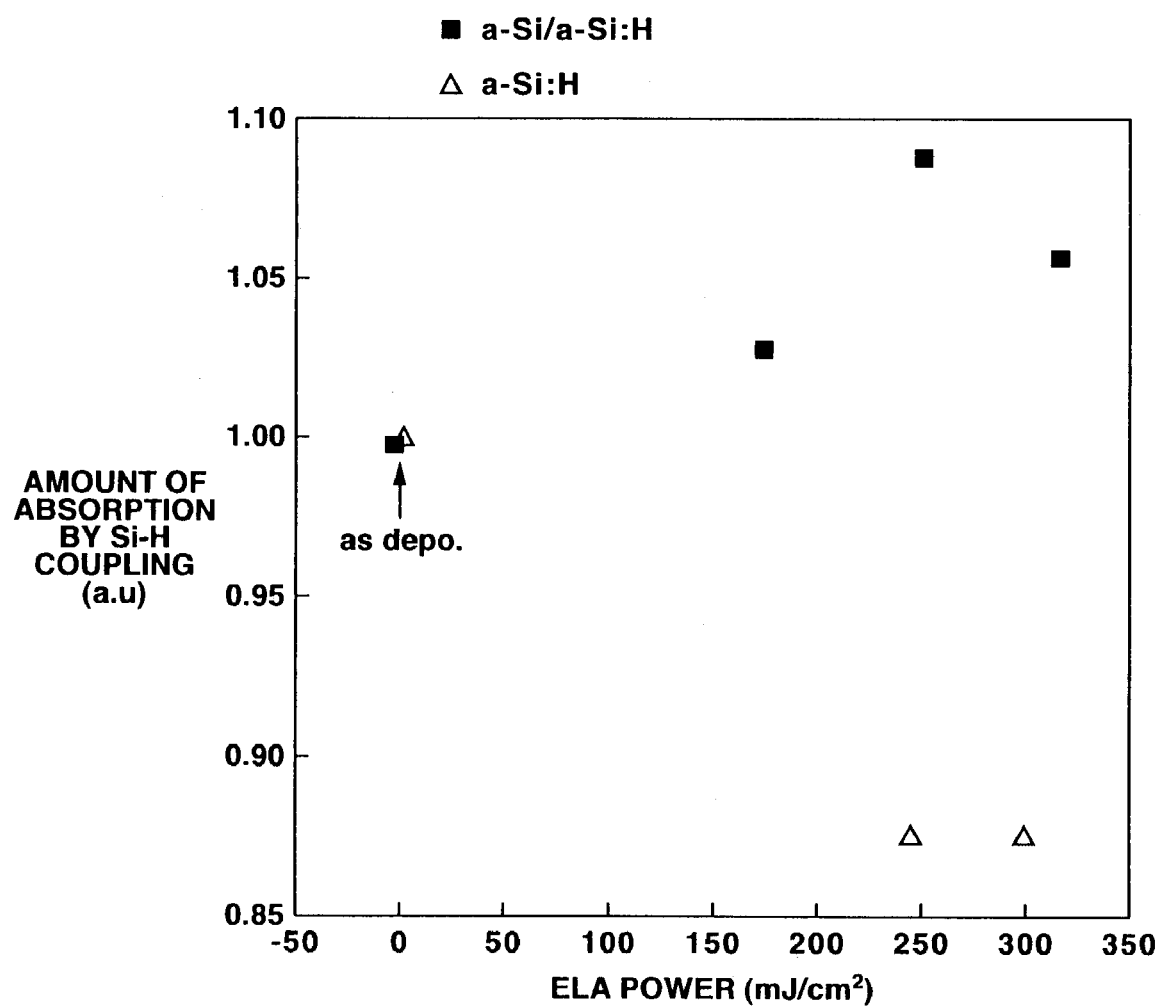
FIG. 11 is a graph showing the results of measurement of the FTIR measurement of the solar cell shown in FIG. 10.

The crystalline properties and the manner of crystallization of the doping layer 7 of the solar cell 10 as well as characteristics of the solar cell 10 can readily be confirmed in detail from FIG. 10 showing the relation between the rate of crystallization and the surface reflectance as found by the measurement of UV reflectance measurement employing the light of 200 nm and from FIG. 11 showing the measured results of FTIR positive reflection.

The results of UV reflectance shown in FIG. 10 are hereinafter explained.

The decreasing reflectance on the film surface by UV reflection indicates the increasing light scattering on the film surface. Thus, the amount of light transmitted is decreased acutely by light scattering brought about by providing the doping layer 7 with an electrode layer 8 such as a transparent electrically conductive film. The amount of light transmitted through the surface layer directly represents the amount of light irradiated on the i-layer in the solar cell 10, so that, if the reflectance on the doping layer 7 is decreased, the amount of light irradiated on the i-layer is decreased, thus affecting the conversion efficiency.

The results of measurement of FIG. 10 clarifies the following: If the high energy laser light is directly irradiated on an a-Si:H, the reflectance is decreased, from which it may be inferred that the surface film is subjected to ablation. On the other hand, if the laser light is irradiated on the surface of the structure of a-Si/a-Si:H, such as that of the solar cell 10, the reflectance is improved, thus indicating that the crystallization on the structure surface is optimum.

The results of measurement of FTIR in FIG. 11 are hereinafter explained.

Since the state of the Si—H bond, as measured by FTIR, is intimately related with the photoconductivity and dark conductivity of the i-layer (see, for example, M. Sumiya, M. Kawasaki, H. Koinuma; Proceedings of the 10th symposium on plasma proceeding, Osaka, I-2, 1992), the characteristics of the solar cell 10 can be checked by measuring the state of Si—H linkage.

FIG. 11 shows the transition of the peak quantity in case of the Si—H bond contained in the entire film as measured by the positive reflection type FTIR method, that is, the transition of the amount of the Si—H bond contained in the film.

In FIG. 11, a plot at a location marked as-depo denotes the value of the peak of the Si—H bond of an a-Si film formed on an a-Si:H film of 600 nm in thickness by a sputtering device to a thickness of approximately 60 nm (■) and that of an a-Si:H film (∆) 600 nm in thickness. FIG. 11 shows the amount of displacement of a peak amount of the Si—H bond after laser irradiation in case these values are normalized to unity (1).

Referring to FIG. 11, the surface of the a-Si/a-Si:H, which is a structure owned by the solar cell 10, or the doping layer 7 in the solar cell 10, is annealed with an excimer laser, the Si—H peaks, required for demonstrating high photoelectric characteristics, are increased, thus testifying to improved film quality, without deterioration in the film quality.

Conversely, should the excimer laser be irradiated on the a-Si:H containing a large quantity of hydrogen in the doping layer, as a structure owned by a conventional solar cell, distinct from the solar cell 10, the process of destruction of the Si—H bond can be recognized, thus indicating that the film being formed is low in characteristics. If the photoconductivity at this time is checked, the dark conductivity, which is the conductivity when the light is not irradiated on the photoelectric conversion device is on the order of $1 \times 10^{-7}$ S/cm, whilst the photoconductivity as the conductivity when the light is irradiated on the photoelectric conversion device is on the order of $1 \times 10^{-5}$ S/cm, indicating that the difference between the dark conductivity and photoconductivity is of an extremely small value corresponding to two digits of magnitudes. If the difference the dark conductivity and photoconductivity is large, the effect on light irradiation of the solar cell increases, so that, in this case, it may be is seen that the efficiency of the solar cell is lowered appreciably.

The bond density of Si—H of the poly-crystallized doping layer 7 of the solar cell 10 is calculated by referring to FIG. 11.

If, on an upper part of the a-Si:H film, corresponding to the amorphous layer 6 of the solar cell 10, an a-Si, corresponding to the doping layer 7 of the solar cell 10, is formed to a thickness of approximately 60 nm, and excess hydrogen in the a-Si:H film is adsorbed following laser irradiation to the upper a-Si layer, the overall increase of the Si—H bond may be regarded as being an increased amount of the Si—H bond in the a-Si film corresponding to the doping layer 7 of the solar cell 10 formed to a thickness of approximately 60 nm.

The density of the Si—H bond, calculated from the peak area of the Si—H peak, as measured from the Brodsky equation and FTIR, is approximately $7.9 \times 10^{21}$ (atom/cm$^3$) in the as-depo, while being $8.2 \times 10^{21}$ (atom/cm$^3$), $8.6 \times 10^{21}$ (atom/cm$^3$) and $8.4 \times 10^{21}$ (atom/cm$^3$) in case of irradiation with the laser power of 185 mJ/cm$^2$, 250 mJ/cm$^2$ and 310 mJ/cm$^2$, respectively.

Thus, the bond density of si-H in the sputtered layer portion in the doping layer 7 of the solar cell 10 following crystallization by laser irradiation is approximately $3.3 \times 10^{21}$ (atom/cm$^3$), approximately $7.7 \times 10^{21}$ (atom/cm$^3$) and approximately $5.5 \times 10^{21}$ (atom/cm$^3$), for the irradiation 185 mJ/cm$^2$, 250 mJ/cm$^2$ and 310 mJ/cm$^2$, respectively.

Figure 12:
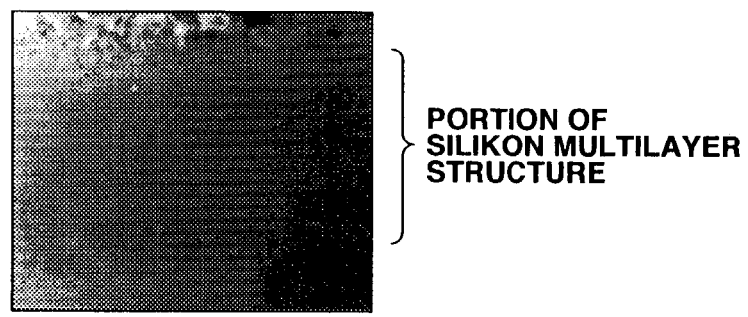
FIG. 12 is a first cross-sectional view of the solar cell shown in FIG. 10, as imaged by a TEM.

FIG. 12 shows a photo by TEM of a polycrystalline (micro-crystal)/amorphous/polycrystalline structure prepared by depositing an a-Si corresponding to the doping layer 7 of the solar cell 10 by the sputtering device on the a-Si:H film of 600 nm in thickness corresponding to the amorphous layer 6 of the solar cell 10 and by irradiating the excimer laser. If laser light of a stronger energy of approximately 310 mJ/cm$^2$ is irradiated, there is prepared a polycrystalline area of approximately 30 nm on the surface, with the crystal grain becoming smaller from the surface to the substrate side. If the irradiating energy is decreased, the size of the surface crystals is naturally decreased.

For checking for the value of the doping efficiency of the doping layer 7 of the solar cell 10, a PH$_3$ plasma is directed to the a-Si film surface 40 nm in thickness, sputtered on the a-Si:H film, 600 nm in thickness, corresponding to the amorphous layer 6 of the solar cell 10 to adsorb phosphorus, after which the excimer laser is irradiated to prepare the doping layer 7 as a polycrystalline layer doped with phosphorus.

Figure 13:
FIG. 13 is a second cross-sectional view of the solar cell shown in FIG. 10, as imaged by a TEM.

FIG. 13 shows the results of structure observation by TEM on phosphorus doping. These results indicate that the average crystal size of the uppermost surface is approximately 30 nm, and that the crystal size on averaging the crystal grain size of the entire film along the depth-wise direction may be regarded as being approximately 10 nm.

Figure 14:
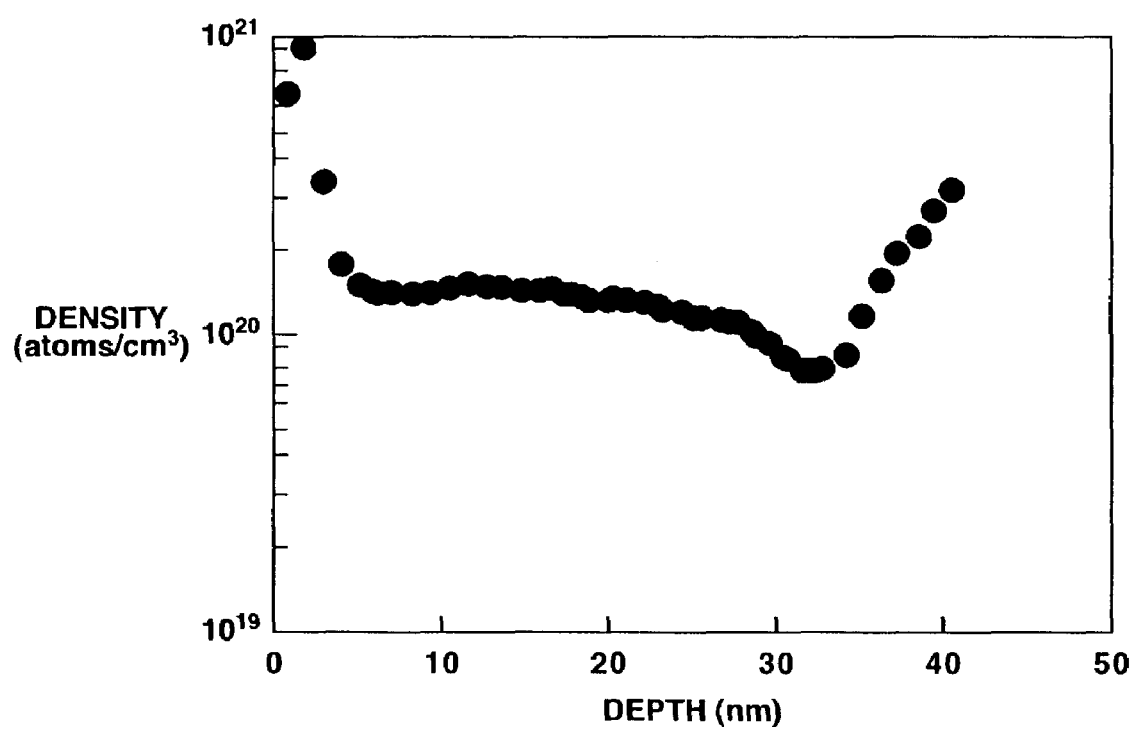
FIG. 14 shows the results of measurement by SIMS of the solar cell shown in FIG. 10.

FIG. 14 shows measured results of the phosphorus concentration by SIMS of the a-Si film, doped with phosphorous. The results by SIMS shown in FIG. 14 indicate that phosphorus is doped by approximately $1.5 \times 10^{20}$ atom/cm$^{-3}$ into the a-Si film. The results of measurement of the positive holes in the a-Si film, doped with phosphorus, indicate that the carrier density amounts to $1.5 \times 10^{20}$ cm$^{-3}$.

Since it may be presumed that substantially the totality of phosphorus doped in the a-Si film contributes to the carriers of the a-Si film, it is seen that the doping efficiency of the a-Si film in its entirety nearly equal to 100% has been achieved. On the other hand, comparison of the observed results of the structure by TEM shown in FIG. 13 to the measured results of the phosphorus concentration by SIMS shown in FIG. 14 reveal that the doping efficiency for the film of the average crystal grain size of approximately 10 nm in the direction of depth, that is in the layering direction, of the a-Si film is approximately 100%.

It may be seen from above that, since the solar cell 10 embodying the present invention includes the highly crystalline doping layer 7 and the doping efficiency of the doping layer 7 is that high, it is possible to improve the conversion efficiency.

Since the solar cell 10 is of the p-i-n structure, and the i-layer is the amorphous silicon-based thin film, the optical absorption coefficient of the i-layer is higher, such that the thickness of the i-layer necessary for photoelectric conversion can be one-hundredth of that in case of the crystalline silicon based solar cell.

Moreover, since the plastics substrate 1 is used as a substrate in the solar cell 10, the solar cell can be molded to an optional shape at a lower temperature, so that it is high in mass producibility and reduced in machining cost. Since the solar cell 10 uses the amorphous thin film, the manufacturing cost can be further suppressed as compared to that of the bulk solar cell such as single crystal and polycrystalline solar cell.

EXAMPLE

For clarifying the effect of the present invention further, explanation is made of several Examples for specified preparation of the solar cell 10, and Comparative Examples for preparation of the solar cell 10 crystallized with a higher hydrogen concentration of the doping layer and for preparation of the solar cell having an amorphous doping layer.

The Example is a solar cell 10 having the doping layer 7 and the amorphous layer 6 of the μc-Si:H/a-Si:H structure, while the Comparative Examples are the solar batteries 10 in which the doping layer 7 and the amorphous layer 6 are of the a-Si:H/a-Si:H structure.

Figure 15:
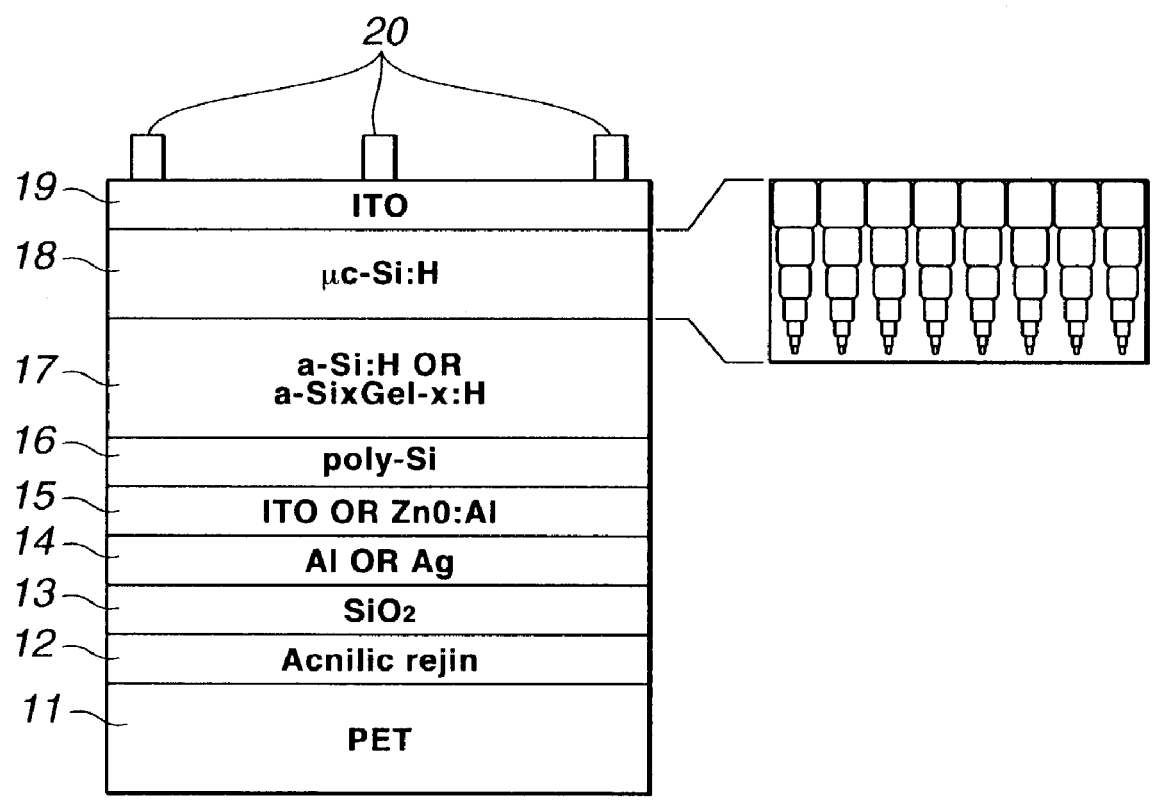
FIG. 15 is a cross-sectional view for illustrating a specified structure of the solar cell shown in FIG. 10.

FIG. 15 schematically shows the solar cell 10 prepared by a technique explained in connection with the following Examples 1 to 13. These Examples are now explained by referring to FIG. 15.

Example 1

First, a PET substrate 11, carrying an acrylic resin layer 12 hard-coated thereon, is rinsed and placed on a substrate holder of a sputtering device with the acrylic resin layer 12 facing upwards. The sputtering device 2 is evacuated by a vacuum pump to $10^{-6}$ Torr, while the surface temperature of the PET substrate 11 was set to 120° C.

On the upper surface of the acrylic resin layer 12 was formed $SiO_2$ to a thickness of 300 nm by reactive sputtering to form an $SiO_2$ layer 13, which later becomes a thermal buffer layer in the course of the subsequent heat treatment process. Then, Al is formed by DC sputtering to a thickness of 200 nm to form an Al layer 14. An ITO layer 15 then is formed to a thickness of 50 nm to form an electrode. This Al layer 14 and the ITO layer 15 are formed to serve as the electrode and as the reflecting film on the reverse surface, respectively.

Then, at a power of 1000 W, a plasma was produced and a target substrate doped with phosphorus was DC sputtered to form an a-Si film of 5 nm doped with phosphorus.

The film formed was irradiated with the XeCl excimer laser to a maximum of 200 mJ/cm² to form a crystallized poly-Si layer 16.

The line beam, used at this time, has an energy gradient such that the energy intensity is gradually increased from one end of the short beam axis direction. By gradually scanning the film from the low energy strength side, the film is crystallized, as the film damage due to emission of Ar slightly captured into the film is suppressed. This poly-Si layer 16 becomes a lower impurity addition layer in the solar cell 10. Here, the a-Si film, doped with phosphorus, operates as the n-type semiconductor layer.

Then, on the poly-Si layer 16 was caused to flow 50 sccm of $SiH_4$ (10%)/$H_2$ and, as the pressure in discharging was set to 20 mTorr and as the surface temperature of the PET substrate 11 was set to 120° C., a non-doped a-Si—H layer 17 was formed to 600 nm. This a-Si—H layer 17 becomes an optically active layer of the solar cell 10.

On this a-Si—H layer 17 were caused to flow 50 sccm of $SiH_4$ (10%)/$H_2$ and 50 sccm of $B_2H_6$ (1%)/$H_2$ and, as the sputtering device was set to the pressure in discharging of 200 mTorr and the surface temperature of the PET substrate 11 was 120° C., a plasma was generated at a power of 200 W, to form an a-Si:H film of 5 nm doped with boron.

Then, 30 sccm of Ar was caused to flow and the sputtering device was set so that the pressure in discharging was 3 mTorr and the surface temperature of the PET substrate 11 was 120° C. A plasma was generated at the power of 1000 W and the target substrate doped with boron was DC sputtered to form a boron-doped a-Si film of 10 nm. As in forming the poly-Si layer 16, described above, an XeCl excimer laser was irradiated at a maximum of 250 mJ/cm² at the maximum, in terms of a line beam, to form a μc-Si:H layer 18. This μc-Si:H layer 18 becomes an upper impurity addition layer in the solar cell 10. Since here the layer is doped with boron, it operates as a p-type semiconductor.

An ITO target then is formed to 150 nm by RF sputtering to form an ITO layer 19. Finally, Al is formed by sputtering to 200 nm to form an Al current collector electrode 20 by lift off using a resist.

Meanwhile, the μc-Si:H layer 18 is crystallized as the crystal grain size is gradually comminuted form the surface towards the PET substrate 11.

Example 2

First, the PET substrate 11, carrying the acrylic resin layer 12 hard-coated thereon, is rinsed, and put on the substrate holder of the sputtering device, with the acrylic resin layer 12 directing upwards. The sputtering device is evacuated to $10^{-6}$ Torr by a vacuum pump and is set so that the surface temperature of the PET substrate 11 will be 120° C.

On the upper surface of the acrylic resin layer 12 was formed $SiO_2$ to a thickness of 300 nm by reactive sputtering to form an $SiO_2$ layer 13, which later becomes a thermal buffer layer in the course of the subsequent heat treatment process. Then, Al is formed by DC sputtering to a thickness of 200 nm to form an Al layer 14. An ITO layer 15 then is formed to a thickness of 50 nm to form an electrode. This Al layer 14 and the ITO layer 15 are formed to serve as the electrode and as the reflecting film on the reverse surface, respectively.

Then, at a power of 1000 W, a plasma was produced and a target substrate doped with phosphorus was DC sputtered to form an a-Si film of 5 nm doped with phosphorus.

The film formed was irradiated with the XeCl excimer laser to a maximum of 200 mJ/cm² to form a crystallized poly-Si layer 16.

The line beam, used at this time, has an energy gradient such that the energy intensity is gradually increased from one end of the short beam axis direction. By gradually scanning the film from the low energy strength side, the film is crystallized, as the film damage due to emission of Ar slightly captured into the film is suppressed. This poly-Si layer 16 becomes a lower impurity addition layer in the solar cell 10. Here, the a-Si film, doped with phosphorus, operates as the p-type semiconductor layer.

Then, on the poly-Si layer 16 was caused to flow 50 sccm of $SiH_4$ (10%)/$H_2$ and, as the pressure in discharging was set to 20 mTorr and as the surface temperature of the PET substrate 11 was set to 120° C., a non-doped a-Si—H layer 17 was formed to 600 nm. This a-Si—H layer 17 becomes an optically active layer of the solar cell 10.

On this a-Si—H layer 17 were caused to flow 50 sccm of $SiH_4$ (10%)/$H_2$ and 50 sccm of $PH_3$ (1%)/$H_2$ and, as the sputtering device was set to the pressure in discharging of 200 mTorr and the surface temperature of the PET substrate 11 was 120° C., a plasma was generated at a lower of 200 W, to form an a-Si:H film of 5 nm doped with phosphorus.

Then, 30 sccm of Ar was caused to flow and the sputtering device was set so that the pressure in discharging was 3 mTorr and the surface temperature of the PET substrate 11 was 120° C. A plasma was generated at the power of 1000 W and the target substrate doped with phosphorus was DC sputtered to form a phosphorus-doped a-Si film of 10 nm. As in forming the poly-Si layer 16, described above, an XeCl excimer laser was irradiated at a maximum of 250 mJ/cm$^2$ at the maximum, in terms of a line beam, to form a μc-Si:H layer 18. This μc-Si:H layer 18 becomes an upper impurity addition layer in the solar cell 10. Since here the layer is doped with phosphorus, it operates as an n-type semiconductor.

An ITO target then is formed to 150 nm by RF sputtering to form an ITO layer 19. Finally, Al is formed by sputtering to 200 nm to form an Al current collector electrode 20 by lift off using a resist.

Meanwhile, the μc-Si:H layer 18 is crystallized as the crystal grain size is gradually comminuted from the surface of the layer towards the PET substrate 11.

Example 3

First, the PET substrate 11, carrying the acrylic resin layer 12 hard-coated thereon, is rinsed, and put on the substrate holder of the sputtering device, with the acrylic resin layer 12 directing upwards. The sputtering device is evacuated to 10$^{-6}$ Torr by a vacuum pump and is set so that the surface temperature of the PET substrate 11 will be 120° C.

On the upper surface of the acrylic resin layer 12 was formed SiO$_2$ to a thickness of 300 nm by reactive sputtering to form an SiO$_2$ layer 13, which later becomes a thermal buffer layer in the course of the subsequent heat treatment process. Then, Al is formed by DC sputtering to a thickness of 200 nm to form an Al layer 14. An ITO layer 15 then is formed to a thickness of 50 nm to from an electrode. The Al layer 14 and an ITO layer 15 are formed to serve as the electrode and as the reflecting film on the reverse surface, respectively.

Then, at a power of 1000 W, a plasma was produced and a target substrate doped with boron was DC sputtered to form an a-Si film of 5 nm doped with boron.

The film formed was irradiated with the XeCl excimer laser to a maximum of 300 mJ/cm$^2$ to form a crystallized poly-Si layer 16.

The line beam, used at this time, has an energy gradient such that the energy intensity is gradually increased from one end of the short beam axis direction. By gradually scanning the film from the low energy strength side, the film is crystallized, as the film damage due to emission of Ar slightly captured into the film is suppressed. This poly-Si layer 16 becomes a lower impurity addition layer in the solar cell 10. Here, a-Si film, doped with boron, operates as the p-type semiconductor layer.

Then, on the poly-Si layer 16 was formed a non-doped a-Si$_x$Ge$_{1-x}$:H layer 17 (0<x≦1), to a thickness of 600 nm, at a surface temperature of 120° C. of the PET substrate 11. The flow ratio of GeH$_4$ (10%)/H$_2$ to SiH$_4$ (10%)/H$_2$ was gradually changed as from the start of generation of the film so that the film composition will be such that the proportion of x in the a-Si$_x$Ge$_{1-x}$:H layer 17 will be increased from the side PET substrate 11, with the flow of GeH$_4$ (10%)/H$_2$ being interrupted as from a mid stage. This a-Si$_x$Ge$_{1-x}$:H layer 17 (0<x≦1) becomes an optically active layer of the solar cell 10.

On this a-Si$_x$Ge$_{1-x}$:H layer 17 (0<x≦1) were caused to flow 50 sccm of SiH$_4$ (10%)/H$_2$ and 50 sccm of PH$_3$ (1%)/H$_2$ and, as the sputtering device was set to the pressure in discharging of 200 mTorr and the surface temperature of the PET substrate 11 was 120° C., a plasma was generated at a power of 20W, to form an a-Si:H film of nm doped with phosphorus.

Then, 30 sccm of Ar was caused to flow and the sputtering device was set so that the pressure in discharging was 3 mTorr and the surface temperature of the PET substrate 11 was 120° C. A plasma was generated at the power of 1000 W and the target substrate doped with boron was DC sputtered to form aphosphorus-doped a-Si film of 10 nm. As in forming the poly-Si layer 16, described above, an XeCl excimer laser was irradiated at a maximum of 250 mJ/cm$^2$ at the maximum, in terms of a line beam, to form a μc-Si:H layer 18. This μc-Si:H layer 18 becomes an upper impurity addition layer in the solar cell 10. Since here the layer is doped withphosphorus, it operates as an n-type semiconductor.

An ITO target then is formed to 150 nm by RF sputtering to form an ITO layer 19. Finally, Al is formed by sputtering to 200 nm to form an Al current collector electrode 20 by lift off using a resist.

Meanwhile, the μc-Si:H layer 18 is crystallized as the crystal grain size is gradually comminuted form the surface towsrdfs the PET substrate 11.

Example 4

First, the PET substrate 11, carrying the acrylic resin layer 12 hard-coated thereon, is rinsed, and put on the substrate holder of the sputtering device, with the acrylic resin layer 12 directing upwards. The sputtering device is evacuated to 10$^{-6}$ Torr by a vacuum pump and is set so that the surface temperature of the PET substrate 11 will be 120° C.

On the upper surface of the acrylic resin layer 12 was formed SiO$_2$ to a thickness of 300 nm by reactive sputtering to form an SiO$_2$ layer 13, which later becomes a thermal buffer layer in the sourse of the subsequent heat treatment process. Then, Al is formed by DC sputtering to a thickness of 200 nm to form an Al layer 14. An ITO layer 15 then is formed to a thickness of 50 nm to from an electrode. The Al layer 14 and the ITO layer 15 are formed to serve as the electrode and as the reflecting film on the reverse surface, respectively.

Then, at a power of 1000 W, a plasma was produced and a target substrate doped with boron was DC sputtered to form an a-Si film of 5 nm doped with phosphorus.

The film formed was irradiated with the XeCl excimer laser to a maximum of 200 mJ/cm$^2$ to form a crystallized poly-Si layer 16.

The line beam, used at this time, has an energy gradient such that the energy intensity is gradually increased from one end of the beam short axis direction. By gradually scanning the film from the low energy strength side, the film is crystallized, as the film damage due to emission of Ar slightly captured into the film is minimized. This poly-Si layer 16 becomes a lower impurity addition layer in the solar cell 10. Here, a-Si film, doped with phosphorus, operates as the n-type semiconductor layer.

Then, on the poly-Si layer 16, an a-Si$_x$Ge$_{1-x}$:H layer 17 (0<x≦1) of, at a surface temperature of 120° C. of the PET substrate 11, a non-doped was formed to 600 nm. The flow ratio of GeH$_4$ (10%)/H$_2$ to SiH$_4$ (10%)/H$_2$ was gradually changed as from the start of generation of the film so that the film composition will be such that the proportion of x in the a-Si$_x$Ge$_{1-x}$:H layer 17 (0<x≦1) will be increased from the side PET substrate 11, with the flow of GeH$_4$ (10%)/H$_2$ being interrupted as from a mid stage. This a-Si$_x$Ge$_{1-x}$:H layer 17 (0<x≦1) becomes an optically active layer of the solar cell 10.

On this a-Si$_x$Ge$_{1-x}$:H layer 17 (0<x≦1) were caused to flow 50 sccm of SiH$_4$ (10%)/H$_2$ and 50 sccm of B$_2$H$_6$ (1%)/H$_2$ and, as the sputtering device was set to the pressure in discharging of 200 mTorr and the surface temperature of the PET substrate 11 was 120° C., a plasma was generated at a lower of 20 W, to form an a-Si:H film of 5 nm doped with boron.

Then, 30 sccm of Ar was caused to flow and the sputtering device was set so that the pressure in discharging was 3 mTorr and the surface temperature of the PET substrate 11 was 120° C. A plasma was generated at the power of 1000 W and the target substrate doped with boron was DC sputtered to form a boron-doped a-Si film of 10 nm. As in forming the poly-Si layer 16, described above, an XeCl excimer laser was irradiated at a maximum of 250 mJ/cm$^2$, in terms of a line beam, to form a μc-Si:H layer 18. This μc-Si:H layer 18 becomes an upper impurity addition layer in the solar cell 10. Since here the layer is doped with boron, it operates as a p-type semiconductor.

An ITO target then is formed to 150 nm by RF sputtering to form an ITO layer 19. Finally, Al is formed by sputtering to 200 nm to form an Al current collector electrode 20 by lift off using a resist.

Meanwhile, the μc-Si:H layer 18 is crystallized as the crystal grain size is gradually comminuted form the surface towards the PET substrate 11.

Example 5

First, the PET substrate 11, carrying the acrylic resin layer 12 hard-coated thereon, is rinsed, and put on the substrate holder of the sputtering device, with the acrylic resin layer 12 directing upwards. The sputtering device is evacuated to 10$^{-6}$ Torr by a vacuum pump and is set so that the surface temperature of the PET substrate 11 will be 120° C.

On the upper surface of the acrylic resin layer 12 was formed SiO$_2$ to a thickness of 300 nm by reactive sputtering to form an SiO$_2$ layer 13, which later becomes a thermal buffer layer in the course of the subsequent heat treatment process. Then, Al is formed by DC sputtering to a thickness of 200 nm to form an Al layer 14. An ITO layer 15 then is formed to a thickness of 50 nm to from an electrode. The Al layer 14 and the ITO layer 15 are formed to serve as the electrode and as the reflecting film on the reverse surface, respectively.

Then, at a power of 1000 W, a plasma was produced and a target substrate doped with boron was DC sputtered to form an a-Si film of 10 nm doped with boron.

The film formed was irradiated with the XeCl excimer laser to a maximum of 300 mJ/cm$^2$ to form a crystallized poly-Si layer 16.

The line beam, used at this time, has an energy gradient such that the energy intensity is gradually increased from one end of the short beam axis direction. By gradually scanning the film from the low energy strength side, the film is crystallized, as the film damage due to emission of Ar slightly captured into the film is minimized. This poly-Si layer 16 becomes a lower impurity addition layer in the solar cell 10. Here, a-Si film, doped with boron, operates as the p-type semiconductor layer.

Then, on the poly-Si layer 16 was caused to flow 50 sccm of SiH$_4$ (10%)/H$_2$ and, as the pressure in discharging was set to 20 mTorr and as the surface temperature of the PET substrate 11 was set to 120° C., a non-doped a-Si—H layer 17 was formed to 600 nm. This a-Si—H layer 17 becomes an optically active layer of the solar cell 10.

Then, 30 sccm of Ar was caused to flow and the sputtering device was set so that the pressure in discharging was 3 mTorr and the surface temperature of the PET substrate 11 was 120° C. A plasma was generated at the power of 1000 W and the target substrate doped with boron was DC sputtered to form a boron-doped a-Si film of 10 nm. As in forming the poly-Si layer 16, described above, an XeCl excimer laser was irradiated at a maximum of 250 mJ/cm$^2$, in terms of a line beam, to form a μc-Si:H layer 18. This μc-Si:H layer 18 becomes an upper impurity addition layer in the solar cell 10. Since here the μc-Si:H layer is doped with phosphorus, it operates as a n-type semiconductor.

An ITO target then is formed to 150 nm by RF sputtering to form an ITO layer 19. Finally, Al is formed by sputtering to 200 nm to form an Al current collector electrode 20 by lift off using a resist.

Meanwhile, the μc-Si:H layer 18 is crystallized as the crystal grain size is gradually comminuted from the layer surface towards the PET substrate 11.

Example 6

First, the PET substrate 11, carrying the acrylic resin layer 12, hard-coated thereon, is rinsed, and put on the substrate holder of the sputtering device, with the acrylic resin layer 12 directing upwards. The sputtering device is evacuated to 10$^{-6}$ Torr by a vacuum pump and is set so that the surface temperature of the PET substrate 11 will be 120° C.

On the upper surface of the acrylic resin layer 12 was formed SiO$_2$ to a thickness of 300 nm by reactive sputtering to form an SiO$_2$ layer 13, which later becomes a thermal buffer layer in the course of the subsequent heat treatment process. Then, Al is formed by DC sputtering to a thickness of 200 nm to form an Al layer 14. An ITO layer 15 then is formed to a thickness of 50 nm to from an electrode. This Al layer 14 and the ITO layer 15 are formed to serve as the electrode and as the reflecting film on the reverse surface, respectively.

Then, at a power of 1000 W, a plasma was produced and a target substrate doped with phosphorus was DC sputtered to form an a-Si film of 10 nm doped with phosphorus.

The film formed was irradiated with the XeCl excimer laser to a maximum of 300 mJ/cm$^2$ to form a crystallized poly-Si layer 16.

The line beam, used at this time, has an energy gradient such that the energy intensity is gradually increased from one end of the short beam axis direction. By gradually scanning the film from the low energy strength side, the film is crystallized, as the film damage due to emission of Ar slightly captured into the film is minimized. This poly-Si layer 16 becomes a lower impurity addition layer in the solar cell 10. Here, the a-Si film, doped with phosphorus, operates as the n-type semiconductor layer.

Then, on the poly-Si layer 16 was caused to flow 50 sccm of SiH$_4$ (10%)/H$_2$ and, as the pressure in discharging was set to 20 mTorr and as the surface temperature of the PET substrate 11 was set to 120° C., a non-doped a-Si—H layer 17 was formed to 600 nm. This a-Si—H layer 17 becomes an optically active layer of the solar cell 10.

Then, 30 sccm of Ar was caused to flow and the sputtering device was set so that the pressure in discharging was 3 mTorr and the surface temperature of the PET substrate 11 was 120° C. A plasma was generated at the power of 1000 W and the target substrate doped with boron was DC sputtered to form a boron-doped a-Si film of 10 nm. As in forming the poly-Si layer 16, described above, an XeCl excimer laser was irradiated at a maximum of 250 mJ/cm$^2$, in terms of a line beam, to form a μc-Si:H layer 18. This μc-Si:H layer 18 becomes an upper impurity addition layer in the solar cell 10. Since here the layer is doped with boron, it operates as a p-type semiconductor.

An ITO target then is formed to 150 nm by RF sputtering to form an ITO layer 19. Finally, Al is formed by sputtering to 200 nm to form an Al current collector electrode 20 by lift off using a resist.

Meanwhile, the μc-Si:H layer 18 is crystallized as the crystal grain size is gradually comminuted form the surface towards the PET substrate 11.

Example 7

First, the PET substrate 11, carrying the acrylic resin layer 12, hard-coated thereon, is rinsed, and put on the substrate holder of the sputtering device, with the acrylic resin layer 12 directing upwards. The sputtering device is evacuated to $10^{-6}$ Torr by a vacuum pump and is set so that the surface temperature of the PET substrate 11 will be 120° C.

On the upper surface of the acrylic resin layer 12 was formed $SiO_2$ to a thickness of 300 nm by reactive sputtering to form an $SiO_2$ layer 13, which later becomes a thermal buffer layer in the course of the subsequent heat treatment process. Then, Ag is formed by DC sputtering to a thickness of 200 nm to form an Ag layer 14. A ZnO; Al layer 15 then is formed to a thickness of 50 nm by reactive sputtering to form an electrode. This Ag layer 14 and the ZnO; Al layer 15 are formed to serve as the electrode and as the reflecting film on the reverse surface, respectively.

The electrode was placed on the substrate holder of the sputtering device, with the surface thereof carrying this ZnO; Al layer 15 directing upwards, and evacuated to approximately $10^{-6}$ Torr, using a vacuum pump. A plasma was formed at a power of 1000 W and the target substrate doped with phosphorus was DC sputtered to form an a-Si substrate of 10 nm doped with phosphorus.

The film formed was irradiated with the XeCl excimer laser to a maximum of 300 mJ/cm² to form a crystallized poly-Si layer 16.

The line beam, used at this time, has an energy gradient such that the energy intensity is gradually increased from one end of the beam short axis direction. By gradually scanning the film from the low energy strength side, the film is crystallized, as the film damage due to emission of Ar slightly captured into the film is minimized. This poly-Si layer 16 becomes a lower impurity addition layer in the solar cell 10. Here, a-Si film, doped with phosphorus, operates as the n-type semiconductor layer.

Then, on the poly-Si layer 16 was caused to flow 50 sccm of $SiH_4$ (10%)/$H_2$ and, as the pressure in discharging was set to 20 mTorr and as the surface temperature of the PET substrate 11 was set to 120° C., a non-doped a-Si—H layer 17 was formed to 600 nm. This a-Si—H layer 17 becomes an optically active layer of the solar cell 10.

On an upper surface of the non-doped a-Si:H layer 17 was formed an a-Si film, to 30 nm, using a target, doped with boron, by a sputtering method.

On this a-Si film, 50 sccm of $H_2$ and 10 sccm of $B_2H_6$ (1%)/$H_2$ were caused to flow for exposure to a plasma generated at 20W for three minutes. An XeCl excimer laser was irradiated in a line beam of 250 mJ/cm² at the maximum to carry out crystallization and doping simultaneously to form a μc-Si:H layer 18, which layer 18 later becomes an upper impurity addition layer in the solar cell 10. Here, the a-Si layer, doped with boron, operates as a p-type semiconductor.

Then, an ITO target film is formed to 150 nm by RF sputtering to form an ITO layer 19. Finally, Al is formed to 200 nm by sputtering and an Al current collecting electrode 20 was formed by lift-off employing a resist.

Meanwhile, the μc-Si:H layer 18 is crystallized as the crystal grain size is progressively reduced from the surface towards the PET substrate 11.

Example 8

First, the PET substrate 11, carrying the acrylic resin layer 12, hard-coated thereon, is rinsed and placed on the substrate holder of the sputtering device, with the acrylic resin layer 12 facing upwards. The sputtering device was evacuated by a vacuum pump to $10^{-6}$ Torr and the surface tem of the PET substrate 11 was set to 120° C.

On the upper surface of the acrylic resin layer 12, an $SiO_2$ film 13 was formed to 300 nm by reactive sputtering to form an $SiO_2$ layer 13, which later becomes a thermal buffer layer in the course of the subsequent heat treatment process. Then, Ag is formed by DC sputtering to a thickness of 200 nm to form an Ag layer 14. A ZnO; Al layer 15 then is formed to a thickness of 50 nm to form an electrode. This Ag layer 14 and the ZnO; Al layer 15 are formed to serve as the electrode and as the reflecting film on the reverse surface, respectively.

The electrode was placed on the substrate holder of the sputtering device, with the surface thereof carrying this ZnO; Al layer 15 directing upwards, and evacuated to approximately $10^{-6}$ Torr, using a vacuum pump. A plasma was formed at a power of 1000 W and th target substrate doped with boron was DC sputtered to form an a-Si substrate of 10 nm doped with boron.

The film formed was irradiated with the XeCl excimer laser to a maximum of 300 mJ/cm² to form a crystallized poly-Si layer 16.

The line beam, used at this time, has an energy gradient such that the energy intensity is gradually increased from one end of the short beam axis direction. By gradually scanning the film from the low energy strength side, the film is crystallized, as the film damage due to emission of Ar slightly captured into the film is minimized. This poly-Si layer 16 becomes a lower impurity addition layer in the solar cell 10. Here, the a-Si film, doped with boron, operates as the p-type semiconductor layer.

Then, on the poly-Si layer 16 was caused to flow 50 sccm of $SiH_4$ (10%)/$H_2$ and, as the pressure in discharging was set to 20 mTorr and as the surface temperature of the PET substrate 11 was set to 120° C., a non-doped a-Si—H layer 17 was formed to 600 nm. This a-Si—H layer 17 becomes an optically active layer of the solar cell 10.

On an upper surface of the non-doped a-Si:H layer 17 was formed an a-Si film, to 30 nm, using a target, doped with phosphorus, by a sputtering method.

On this a-Si film, 50 sccm of $H_2$ and 10 sccm of $PH_3$ (1%)/$H_2$ were caused to flow for exposure for three minutes to a plasma generated at 20 W. An XeCl excimer laser was irradiated in a line beam of 250 mJ/cm² at the maximum to carry out crystallization and doping simultaneously to form a μc-Si:H layer 18, which layer 18 later becomes an upper impurity addition layer in the solar cell 10. Here, the a-Si layer, doped with phosphorus, operates as an n-type semiconductor.

Then, an ITO target film is formed to 150 nm by RF sputtering to form an ITO layer 19. Finally, AL is formed to 200 nm by sputtering and an Al current collecting electrode 20 was formed by lift-off employing a resist.

Meanwhile, the μc-Si:H layer 18 is crystallized as the crystal grain size is progressively reduced from the surface towards the PET substrate 11.

Example 9

First, the PET substrate 11, carrying the acrylic resin layer 12, hard-coated thereon, is rinsed and placed on the substrate holder of the sputtering device, with the acrylic resin layer 12 facing upwards. The sputtering device was evacuated by a vacuum pump to $10^{-6}$ Torr and the surface temperature of the PET substrate 11 was set to 120° C.

On the upper surface of the acrylic resin layer 12, an $SiO_2$ film was formed to 300 nm by reactive sputtering to form an $SiO_2$ layer 13, which later becomes a thermal buffer layer in the course of the subsequent heat treatment process. Then, Ag is formed by DC sputtering to a thickness of 200 nm to form an Ag layer 14. A ZnO; Al layer 15 then is formed to a thickness of 50 nm to from an electrode. This Ag layer 14 and the ZnO; Al layer 15 are formed to serve as the electrode and as the reflecting film on the reverse surface, respectively.

The electrode was placed on the substrate holder of the sputtering device, with the surface thereof carrying this ZnO; Al layer 15 directing upwards, and was evacuated to approximately $10^{-6}$ Torr, using a vacuum pump. A plasma was formed at a power of 1000 W and th target substrate doped with phosphorus was DC sputtered to form an a-Si substrate of 10 nm doped with phosphorus.

On this a-Si film, 50 sccm of $H_2$ and 10 sccm of $PH_3$ (1%)/$H_2$ were caused to flow for exposure to a plasma generated at 20 W. The film formed was irradiated with the XeCl excimer laser to a maximum of 300 mJ/cm² to form a crystallized poly-Si layer 16.

The line beam, used at this time, has an energy gradient such that the energy intensity is gradually increased from one end of the short beam axis direction. By gradually scanning the film from the low energy strength side, the film is crystallized, as the film damage due to emission of Ar slightly captured into the film is minimized. This poly-Si layer 16 becomes a lower impurity addition layer in the solar cell 10. Here, the a-Si film, doped with phosphorus, operates as the n-type semiconductor layer.

Then, on the poly-Si layer 16, 50 sccm of $SiH_4$ (10%)/$H_2$ was caused to flow and, as the pressure in discharging was set to 20 mTorr and as the surface temperature of the PET substrate 11 was set to 120° C., a non-doped a-Si—H layer 17 was formed to 600 nm. This a-Si—H layer 17 becomes an optically active layer of the solar cell 10.

On an upper surface of the non-doped a-Si:H layer 17 was formed an a-Si film, to 30 nm, using a target, doped with boron, by a sputtering method.

On this a-Si film, 50 sccm of $H_2$ and 10 sccm of $B_2H_6$ (1%)/$H_2$ were caused to flow for exposure to a plasma generated at 20 W. An XeCl excimer laser was irradiated in a line beam of 250 mJ/cm² at the maximum to carry out crystallization and doping simultaneously to form a μc-Si:H layer 18, which layer 18 later becomes an upper impurity addition layer in the solar cell 10. Here, the a-Si layer, doped with boron, operates as a p-type semiconductor.

Then, an ITO target film is formed to 150 nm by RF sputtering to form an ITO layer 19. Finally, AL is formed to 200 nm by sputtering and an Al current collecting electrode 20 was formed by lift-off employing a resist.

Meanwhile, the μc-Si:H layer 18 is crystallized as the crystal grain size is progressively reduced from the surface towards the PET substrate 11.

Example 10

First, the PET substrate 11, carrying the acrylic resin layer 12, hard-coated thereon, is rinsed and placed on the substrate holder of the sputtering device, with the acrylic resin layer 12 facing upwards. The sputtering device was evacuated by a vacuum pump to $10^{-6}$ Torr and the surface tern of the PET substrate 11 was set to 120° C.

On the upper surface of the acrylic resin layer 12, an $SiO_2$ film was formed to 300 nm by reactive sputtering to form an $SiO_2$ layer 13, which later becomes a thermal buffer layer in the course of the subsequent heat treatment process. Then, Ag is formed by DC sputtering to a thickness of 200 nm to form an Ag layer 14. A ZnO; Al layer 15 then is formed to a thickness of 50 nm to from an electrode. This Ag layer 14 and the ZnO; Al layer 15 are formed to serve as the electrode and as the reflecting film on the reverse surface, respectively.

The electrode was placed on the substrate holder of the sputtering device, with the surface thereof carrying this ZnO; Al layer 15 directing upwards, and evacuated to approximately $10^{-6}$ Torr, using a vacuum pump. A plasma was formed at a power of 1000 W and th target substrate doped with phosphorus was DC sputtered to form an a-Si substrate of 10 nm doped with phosphorus.

On this a-Si film, 50 sccm of $H_2$ and 10 sccm of $PH_3$ (1%)/$H_2$ were caused to flow for exposure for three minutes to a plasma generated at 20 W. The film formed was irradiated with the XeCl excimer laser to a maximum of 3000 mJ/cm² to effect crystallization and doping simultaneously to form a crystallized poly-Si layer 16.

The line beam, used at this time, has an energy gradient such that the energy intensity is gradually increased from one end of the beam short axis direction. By gradually scanning the film from the low energy strength side, the film is crystallized, as the film damage due to emission of Ar slightly captured into the film. This poly-Si layer 16 becomes a lower impurity addition layer in the solar cell 10. Here, the poly-Si film, doped with phosphorus, operates as the n-type semiconductor layer.

Then, on the poly-Si layer 16, a non-doped a-$Si_xGe_{1-x}$:H ($0 < x \leq 1$) layer 17 was formed to 600 nm, at a surface temperature of the PET substrate 11 of 120° C. The flow ratio of $GeH_4$ (10%)/$H_2$ to $SiH_4$ (10%)/$H_2$ was gradually changed as from the start of generation of the film so that the film composition will be such that the proportion of x in the a-$Si_xGe_{1-x}$:H layer 17 ($0 < x \leq 1$) will be increased from the side PET substrate 11, with the flow of $GeH_4$ (10%)/$H_2$ being interrupted as from a mid stage, to form the a-Si:H (x=1) film. This a-$Si_xGe_{1-x}$:H layer 17 ($0 < x \leq 1$) becomes an optically active layer of the solar cell 10.

On an upper surface of the non-doped a-$Si_xGe_{1-x}$:H layer 17 ($0 < x \leq 1$) was formed an a-Si film, to 30 nm, using a target, doped with boron, by a sputtering method.

On this a-Si film, 50 sccm of $H_2$ and 10 sccm of $B_2H_6$ (1%)/$H_2$ were caused to flow for exposure to a plasma generated at 20 W for three minutes. An XeCl excimer laser was irradiated in a line beam of 250 mJ/cm² at the maximum to carry out crystallization and doping simultaneously to form a μc-Si:H layer 18, which layer 18 later becomes an upper impurity addition layer in the solar cell 10. Here, the μc-Si:H layer 18, doped with boron, operates as a p-type semiconductor.

Then, an ITO target film is formed to 150 nm by RF sputtering to form an ITO layer 19. Finally, Al is formed to 200 nm by sputtering and an Al current collecting electrode 20 was formed by lift-off employing a resist.

Meanwhile, the μc-Si:H layer 18 is crystallized as the crystal grain size is progressively reduced from the surface towards the PET substrate 11.

Example 11

First, the PET substrate 11, carrying the acrylic resin layer 12, hard-coated thereon, is rinsed and placed on the substrate holder of the sputtering device, with the acrylic resin layer 12 facing upwards. The sputtering device was evacuated by a vacuum pump to $10^{-6}$ Torr and the surface tem of the PET substrate 11 was set to 120° C.

On the upper surface of the acrylic resin layer 12, an $SiO_2$ film was formed to 300 nm by reactive sputtering to form an $SiO_2$ layer 13, which later becomes a thermal buffer layer in the course of the subsequent heat treatment process. Then, Ag is formed by DC sputtering to a thickness of 200 nm to form an Ag layer 14. A ZnO; Al layer 15 then is formed to a thickness of 50 nm to from an electrode. This Ag layer 14 and the ZnO; Al layer 15 are formed to serve as the electrode and as the reflecting film on the reverse surface, respectively.

The electrode was placed on the substrate holder of the sputtering device, with the surface thereof carrying this ZnO; Al layer 15 directing upwards, and evacuated to approximately $10^{-6}$ Torr, using a vacuum pump. A plasma was formed at a power of 1000 W and the target substrate doped with phosphorus was DC sputtered to form an a-Si substrate of 10 nm doped with phosphorus.

On this a-Si film, 50 sccm of $H_2$ and 10 sccm of $PH_3$ (1%)/$H_2$ were caused to flow for exposure for three minutes to a plasma generated at 20 W. The film formed was irradiated with the XeCl excimer laser to a maximum of 3000 mJ/cm$^2$ to effect crystallization and doping simultaneously to form a crystallized poly-Si layer 16.

The line beam, used at this time, has an energy gradient such that the energy intensity is gradually increased from one end of the short beam axis direction. By gradually scanning the film from the low energy strength side, the film is crystallized, as the film damage due to emission of Ar slightly captured into the film is minimized. This poly-Si layer 16 becomes a lower impurity addition layer in the solar cell 10. Here, the poly-Si layer, doped with phosphorus, operates as the n-type semiconductor layer.

Then, on the poly-Si layer 16, a non-doped a-$Si_xGe_{1-x}$:H (0<x≦1) layer 17 was formed to 600 nm, at a surface temperature of the PET substrate 11 of 120° C. The flow ratio of $GeH_4$ (10%)/$H_2$ to $SiH_4$ (10%)/$H_2$ was gradually changed as from the start of generation of the film so that the film composition will be such that the proportion of x in the a-$Si_xGe_{1-x}$:H (0<x≦1) layer 17 will be increased from the side PET substrate 11, with the flow of $GeH_4$ (10%)/$H_2$ being interrupted as from a mid stage, to form the a-Si:H (x=1) film. This a-$Si_xGe_{1-x}$:H (0<x≦1) layer 17 becomes an optically active layer of the solar cell 10.

On an upper surface of the non-doped a-$Si_xGe_{1-x}$:H (0<x≦1) layer 17 was formed an a-$Si_xC_{1-x}$ film, to 30 nm, using an $Si_xC_{1-x}$ target, doped with boron, by a sputtering method.

On this a-$Si_xC_{1-x}$ film, 50 sccm of $H_2$ and 10 sccm of $B_2H_6$ (1%)/$H_2$ were caused to flow for exposure to a plasma generated at 20 W for three minutes. An XeCl excimer laser was irradiated in a line beam of 250 mJ/cm$^2$ at the maximum to carry out crystallization and doping simultaneously to form a µc-Si:H layer 18, which layer 18 later becomes an upper impurity addition layer in the solar cell 10. Here, the µc-Si:H layer 18, doped with boron, operates as a p-type semiconductor.

Then, an ITO target film is formed to 150 nm by RF sputtering to form an ITO layer 19. Finally, Al is formed to 200 nm by sputtering and an Al current collecting electrode 20 was formed by lift-off employing a resist.

Meanwhile, the µc- Si:H layer 18 is crystallized as the crystal grain size is progressively reduced from the layer surface towards the PET substrate 11.

Example 12

First, the PET substrate 11, carrying the acrylic resin layer 12, hard-coated thereon, is rinsed and placed on the substrate holder of the sputtering device, with the acrylic resin layer 12 facing upwards. The sputtering device was evacuated by a vacuum pump to $10^{-6}$ Torr and the surface tem of the PET substrate 11 was set to 120° C.

On the upper surface of the acrylic resin layer 12, an $SiO_2$ film was formed to 300 nm by reactive sputtering to form an $SiO_2$ layer 13, which later becomes a thermal buffer layer in the course of the subsequent heat treatment process.

Then, using a Zn; Al target, a ZnO; Al layer 15 then is formed to a thickness of 50 nm to form an electrode. This ZnO; Al layer 15 is formed to serve as the electrode and as the reflecting film on the reverse surface.

The electrode was placed on the substrate holder of the sputtering device, with the surface thereof carrying this ZnO; Al layer 15 directing upwards, and evacuated to approximately $10^{-6}$ Torr, using a vacuum pump. A plasma was formed at a power of 1000 W and the target substrate doped with boron was DC sputtered to form an a-$Si_xC_{1-x}$ film of 10 nm doped with boron.

On this a-$Si_xC_{1-x}$:H film, 50 sccm of $H_2$ and 10 sccm of $B_2H_6$ (1%)/$H_2$ were caused to flow for exposure to a plasma generated at 20 W for three minutes. An XeCl excimer laser was irradiated in a line beam of 300 mJ/cm$^2$ at the maximum to carry out crystallization and doping simultaneously to form a poly-Si layer 16.

The line beam, used at this time, has an energy gradient such that the energy intensity is gradually increased from one end of the short beam axis direction. By gradually scanning the film from the low energy strength side, the film is crystallized, as the film damage due to emission of Ar slightly captured into the film is minimized. This poly-Si layer 16 becomes a lower impurity addition layer in the solar cell 10. Here, the poly-Si film, doped with boron, operates as the p-type semiconductor layer.

Then, on the poly-Si layer 16, a non-doped a-$Si_xGe_{1-x}$:H (0<x≦1) layer 17 was formed to 600 nm, at a surface temperature of the PET substrate 11 of 120° C. The flow ratio of $GeH_4$ (10%)/$H_2$ to $SiH_4$ (10%)/$H_2$ was gradually changed as from the start of generation of the film so that the film composition will be such that the proportion of x in the a-$Si_xGe_{1-x}$:H (0<x≦1) layer 17 will be decreased from the side PET substrate 11. This a-$Si_xGe_{1-x}$:H (0<x≦1) layer 17 becomes an optically active layer of the solar cell 10.

On an upper surface of the non-doped a-Si:H layer 17 was formed an a-Si film, to 30 nm, using a target, doped with phosphorus, by a sputtering method.

On this a-Si film, 50 sccm of $H_2$ and 10 sccm of $PH_3$ (1%)/$H_2$ were caused to flow for exposure to a plasma generated at 20 W. An XeCl excimer laser was irradiated in a line beam of 250 mJ/cm$^2$ at the maximum to carry out crystallization and doping simultaneously to form a µc-Si:H layer 18, which layer 18 later becomes an upper impurity addition layer in the solar cell 10. Here, the µc-Si:H layer, doped with phosphorus, operates as a n-type semiconductor.

Finally, Al is formed to 200 nm by sputtering and an Al current collecting electrode 20 was formed by lift-off employing a resist. This Al current collecting electrode 20 operates as a reverse surface electrode and as the reverse surface reflecting surface simultaneously.

Meanwhile, the μc-Si:H layer 18 is crystallized as the crystal grain size is progressively reduced from the surface towards the PET substrate 11.

Example 13

First, the PET substrate 11, carrying the acrylic resin layer 12, hard-coated thereon, is rinsed and placed on the substrate holder of the sputtering device, with the acrylic resin layer 12 facing upwards. The sputtering device was evacuated by a vacuum pump to $10^{-6}$ Torr and the surface tem of the PET substrate 11 was set to 120° C.

On the upper surface of the acrylic resin layer 12, an $SiO_2$ film was formed to 300 nm by reactive sputtering to form an $SiO_2$ layer 13, which later becomes a thermal buffer layer in the course of the subsequent heat treatment process. Then, Ag is formed by DC sputtering to a thickness of 200 nm to form an Ag layer 14. A ZnO; Al layer 15 then is formed to a thickness of 50 nm by reactive sputtering to form an electrode. This Ag layer 14 and the ZnO; Al layer 15 are formed to serve as the electrode and as the reflecting film on the reverse surface, respectively.

The electrode was placed on the substrate holder of the sputtering device, with the surface thereof carrying this ZnO; Al layer 15 directing upwards, and was evacuated to approximately $10^{-7}$ Torr, using a vacuum pump. Then, 50 sccm of $SiH_4(10\%)/H_2$ and 10 sccm of $PH_3(1\%)/H_2$ were caused to flow to generate a plasma at 20 W to form an a-Si substrate of 10 nm doped with phosphorus.

The substrate, now carrying the a-Si film, was transported in vacuum to a sputtering chamber and an a-$Si_xGe_{1-x}$ target substrate was DC-sputtered to form an a-$Si_xGe_{1-x}$ film 30 nm in thickness. The film formed was irradiated with the XeCl excimer laser to a maximum of 250 mJ/cm² to form a crystallized poly-Si layer 16.

The line beam, used at this time, has an energy gradient such that the energy intensity is gradually increased from one end of the beam short axis direction. By gradually scanning the film from the low energy strength side, the film is crystallized, as the film damage due to emission of Ar slightly captured into the film. This poly-Si layer 16 becomes a lower impurity addition layer in the solar cell 10. Here, a-Si film, doped with phosphorus, operates as the n-type semiconductor layer.

Then, on the poly-Si layer 16, a non-doped a-$Si_xGe_{1-x}$:H (0<x≦1) layer 17 was formed to 600 nm, at a surface temperature of the PET substrate 11 of 120° C. The flow ratio of $GeH_4$ (10%)/$H_2$ to $SiH_4$ (10%)/$H_2$ was gradually changed as from the start of generation of the film so that the film composition will be such that the proportion of x in the a-$Si_xGe_{1-x}$:H (0<x≦1) layer 17 will be increased from the side PET substrate 11, with the flow of $GeH_4$ (10%)/$H_2$ being interrupted as from a mid stage. This a-$Si_xGe_{1-x}$:H layer 17 (0<x≦1) becomes an optically active layer of the solar cell 10.

On an upper surface of the non-doped a-$Si_xGe_{1-x}$:H (0<x≦1) layer 17 was formed an a-$Si_xC_{1-x}$ film, to 30 nm, using a $Si_xC_{1-x}$ target, doped with boron, by a sputtering method.

On this a-$Si_xC_{1-x}$ film, 50 sccm of $H_2$ and 10 sccm of $B_2H_6$ (1%) were caused to flow for exposure to a plasma generated at 20 W for three minutes. An XeCl excimer laser was irradiated in a line beam of 250 mJ/cm² at the maximum to carry out crystallization and doping simultaneously to form a μc-Si:H layer 18, which layer 18 later becomes an upper impurity addition layer in the solar cell 10. Here, the μc-Si:H layer 18, doped with boron, operates as a p-type semiconductor.

Then, an ITO target film is formed to 150 nm by RF sputtering to form an ITO layer 19. Finally, Al is formed to 200 nm by sputtering and an Al current collecting electrode 20 was formed by lift-off employing a resist.

Meanwhile, the μc-Si:H layer 18 is crystallized as the crystal grain size is progressively reduced from the surface towards the PET substrate 11.

Figure 16:
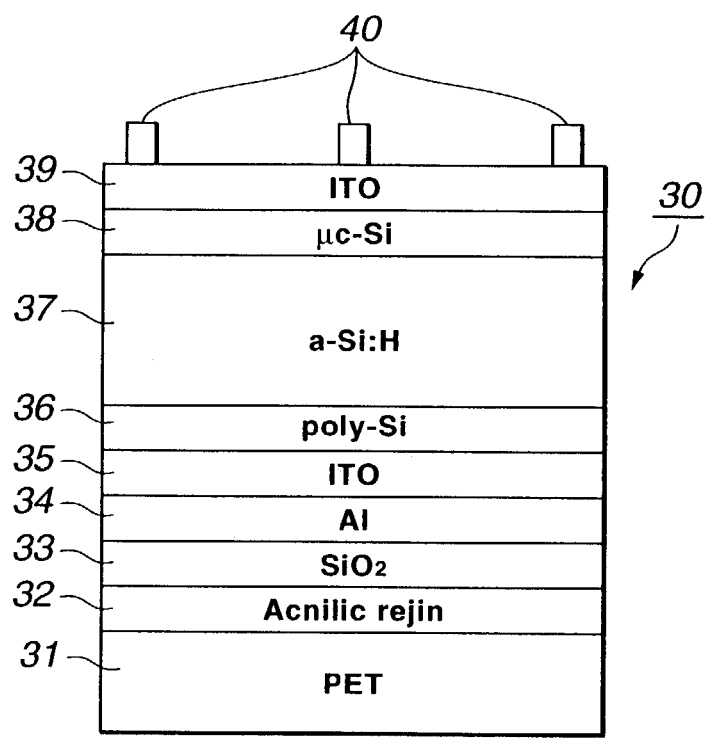
FIG. 16 is a first cross-sectional view for illustrating a specified structure of a conventional solar cell.

FIG. 16 schematically shows a solar cell 30, prepared by a technique shown in the following Comparative Example 1.

Comparative Example 1

First, a PET substrate 31, carrying an acrylic resin layer 32, hard-coated thereon, is rinsed and placed on the substrate holder of the sputtering device, with the acrylic resin layer 32 facing upwards. The sputtering device was evacuated by a vacuum pump to $10^{-6}$ Torr and the surface temperature of the PET substrate 11 was set to 120° C.

On the upper surface of the acrylic resin layer 32, an $SiO_2$ film was formed to 300 nm by reactive sputtering to form an $SiO_2$ layer 33, which later becomes a thermal buffer layer in the course of the subsequent heat treatment process. Then, Al is formed by DC sputtering to a thickness of 200 nm to form an Al layer 34. A ITO layer 35 then is formed to a thickness of 50 nm to form an electrode. This Al layer 34 and the ITO layer 35 are formed to serve as the electrode and as the reflecting film on the reverse surface, respectively.

A plasma was generated at a power of 1000 W for DC sputtering the target substrate doped with phosphorus to form an a-Si film of 5 nm doped with boron.

The film formed was irradiated with the XeCl excimer laser to a maximum of 300 mJ/cm² to form a crystallized poly-Si layer 36.

The line beam, used at this time, has an energy gradient such that the energy intensity is gradually increased from one end of the beam short axis direction. By gradually scanning the film from the low energy strength side, the film is crystallized, as the film damage due to emission of Ar slightly captured into the film is minimized. This poly-Si layer 36 becomes a lower impurity addition layer in the solar cell 30. Here, the poly-Si film, doped with boron, operates as the p-type semiconductor layer.

Then, on the poly-Si layer 36 was caused to flow 50 sccm of $SiH_4$ (10%)/$H_2$ and, as the pressure in discharging was set to 20 mTorr and as the surface temperature of the PET substrate 31 was set to 120° C., a non-doped a-Si—H layer 37 was formed to 600 nm. This a-Si—H layer 37 becomes an optically active layer of the solar cell 30.

On this non-doped a-Si:H layer 37, 50 sccm of $SiH_4$ (10%)/$H_2$ and 50 sccm of $PH_3$ (1%)/$H_2$ were caused to flow and a sputtering device was set so that the pressure in discharging and the surface temperature of the PET substrate 31 will be 200 mTorr and 120° C., respectively. The plasma was generated at a power of 20 W to form an a-Si:H film of 15 nm doped with phosphorus.

As in forming the poly-Si layer 36, described above, an XeCl excimer laser was irradiated in a line beam of 250 mJ/cm² at the maximum to carry out crystallization and doping simultaneously to form a μc-Si:H layer 38, which layer 38 later becomes an upper impurity addition layer in the solar cell 30. Here, the a-Si layer, doped with phosphorus, operates as an n-type semiconductor.

Then, an ITO target film is formed to 150 nm by RF sputtering to form an ITO layer 39. Finally, Al is formed to 200 nm by sputtering and an Al current collecting electrode 40 was formed by lift-off employing a resist.

Figure 17:
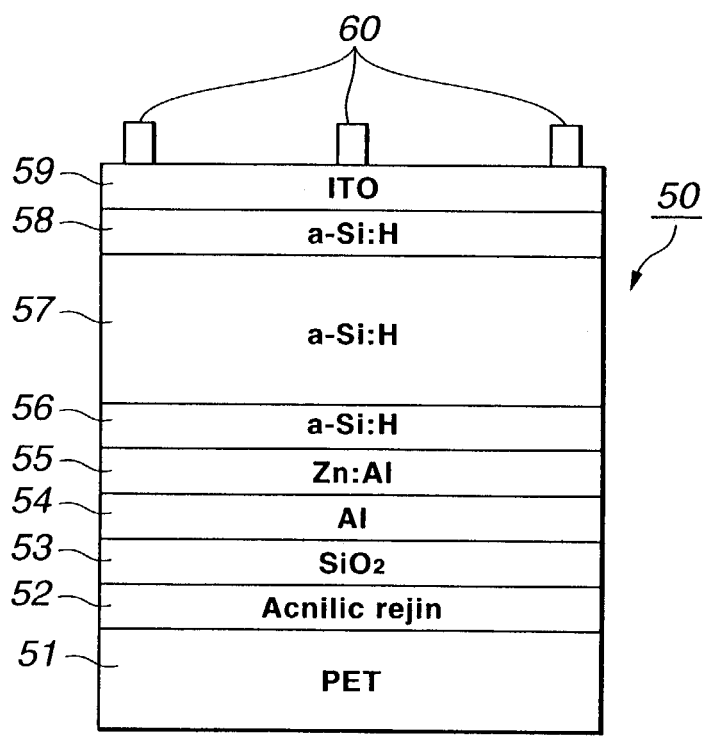
FIG. 17 is a second cross-sectional view for illustrating a specified structure of a conventional solar cell.

FIG. 17 schematically shows a solar cell 50, prepared by a technique shown in the following Comparative Example 2.

Comparative Example 2

First, a PET substrate 51, carrying an acrylic resin layer 52, hard-coated thereon, is rinsed and placed on the substrate holder of the sputtering device, with the acrylic resin layer 52 facing upwards. The sputtering device was evacuated by a vacuum pump to $10^{-6}$ Torr and the surface tem of the PET substrate 51 was set to 120° C.

On the upper surface of the acrylic resin layer 52, an $SiO_2$ film was formed to 300 nm by reactive sputtering to form an $SiO_2$ layer 53, which later becomes a thermal buffer layer in the course of the subsequent heat treatment process. Then, Al is formed by DC sputtering to a thickness of 200 nm to form an Al layer 54. A ZnO; Al layer 55 then is formed by reactive sputtering to a thickness of 50 nm, using a Zn; Al target, to form an electrode. This Ag layer 54 and the ZnO; Al layer 55 are formed to serve as the electrode and as the reflecting film on the reverse surface, respectively.

On this ZnO; Al layer 55, 50 sccm of $SiH_4$ (10%)/$H_2$ and 50 sccm of $PH_3$ (1%)/$H_2$ were caused to flow and a sputtering device was set so that the discharging pressure and the surface temperature of the PET substrate 11 will be 200 mTorr and 120° C., respectively. A plasma was generated at a power of 20 W to form a phosphorus-doped 15 nm a-Si:H layer 56.

This a-Si:H layer 56 becomes a lower impurity adding layer in the solar cell 50. Here, the layer operated as an n-type semiconductor layer because it is doped with phosphorus.

On the poly-Si layer 56 was then caused to flow 50 sccm of Si $H_4$(10%)/$H_2$, as the pressure in discharging was set to 20 mTorr and as the surface temperature of the PET substrate 51 was set to 120° C., to form a non-doped a-Si—H layer 57 to 600 nm. This a-Si—H layer 57 becomes an optically active layer of the solar cell 50.

On this non-doped a-Si—H layer 57 were then caused to flow 50 sccm of $SiH_4$ (10%)/$H_2$ and 50 sccm of $B_2H_6$ (1%)/$H_2$ and, as the sputtering device was set so that the pressure in discharging and as the surface temperature of the PET substrate 11 will be 200 mTorr and 120° C., respectively. A plasma was generated at a power of 20 W to form an a-Si—H layer 58 of 5 nm doped with boron. This a-Si—H layer 58 becomes an upper impurity adding layer in the solar cell 50. Since boron is here doped, the layer operates as a p-type semiconductor.

Then, an ITO target film was formed to 150 nm by RF sputtering to form an ITO layer 59. Finally, Al was formed to 200 nm by sputtering and an Al current collecting electrode 60 was formed by lift-off employing a resist.

In the Comparative Example 1, the μc-Si layer 38 of the solar cell formed appears turbid on visual inspection. The surface film structure is destroyed, so that the film surface scatters the light, as shown in FIG. 10. The UV reflection characteristics on the film surface amounted to 3%. Positive reflection characteristics by FTIR indicated that the Si—H bonds were destroyed appreciably. Thus, it may be inferred that the conversion efficiency of this solar cell is approximately nil.

With the Comparative Example 2, a solar cell having the same structure as that of the solar cell model formed solely of an amorphous structure of $p^+$a-Si:H/a-Si:H/$n^+$a-Si:H was obtained. Thus, referring to FIG. 9, the conversion efficiency may be estimated to be approximately 7%.

On the other hand, with the Examples 1, 4, 6, 7, 9 and 10, a solar cell 10, similar in structure to the solar cell model having the structure of $p^+$μc-Si:H/a-Si:H/$n^+$μc-Si:H shown in FIG. 7 could be prepared.

Therefore, on referring to FIG. 9, the solar cell 10, prepared in this manner, may be expected to have the conversion efficiency of approximately 13%. In particular, with the solar cell 10, prepared as in Examples 4 and 10, in which the i-layer could have a hetero junction structure, the conversion efficiency may be expected to amount to not less than 13%.

In the Examples 11 and 13, a solar cell 10 having the same structure as that of the solar cell model having the structure of $p^+$μc-$Si_xC_{1-x}$:H/a-Si:H/$n^+$μc-Si:H, shown in FIG. 8, could be produced.

So, the conversion efficiency of the solar cell 10, thus prepared, may be expected to amount to approximately 14%, as may be seen from FIG. 9. On the other hand, with the solar cell 10, prepared as in Examples 11 and 13, in which the i-layer could have a hetero junction structure, the conversion efficiency may be expected to amount to not less than 14%.

In Examples 2, 3, 5 and 8, such a solar cell 10, having a structure of $n^+$μc-Si:H/a-Si:H/$p^+$μc-Si:H inverted from the structure of the solar cell model shown in FIG. 7, could be prepared. Therefore, the conversion efficiency of the solar cell 10, thus prepared, may be expected to be higher than that of the solar batteries of the Comparative Examples 1 and 2.

In Example 12, such a solar cell 10, having a structure of $n^+$μc-Si:H/a-Si:H/$p^+$μc-$Si_xC_{1-x}$:H, which is an inverted structure of that of the solar cell model shown in FIG. 8, could be produced. On the other hand, with the solar cell 10, prepared as in Example 12, in which the i-layer could have a hetero junction structure, the conversion efficiency may be expected to be improved further as compared to that of the Examples 2, 3, 5 or 8.

The present invention may be applied not only to the above-described solar cell but also to e.g., a photosensor.

INDUSTRIAL APPLICABILITY

In the optical energy conversion apparatus, according to the present invention, in which the concentration is controlled so that the hydrogen concentration in the impurity doped semiconductor layer formed on an amorphous optically active layer will be lower than that of the optically active layer, the second impurity doped semiconductor layer forms a polycrystalline layer in which the average grain size in a direction proceeding from the surface of the semiconductor layer towards the substrate is decreased stepwise. Thus, by forming the polycrystalline layer in this manner, it is possible to prevent film destruction by hydrogen contained in the impurity adding layer produced on crystallization by laser annealing to form the impurity adding layer into a polycrystal having optimum crystallinity, thereby improving the conversion efficiency.

The optical energy conversion apparatus according to the present invention includes the impurity doped semiconductor layer which is a polycrystal having optimum crystallinity, and the amorphous optically active layer, therefore an apparatus of a thin type is realized.

With the manufacturing method for the optical energy conversion apparatus according to the present invention, in which an impurity doped semiconductor layer having a hydrogen concentration lower than that of the optically active layer is formed on an amorphous optically active layer and is subjected to laser annealing, it is possible to form a polycrystalline layer in which the average grain size of the impurity doped semiconductor layer is decreased stepwise in the direction from the surface of the semiconductor layer towards the substrate.

Therefore, with the optical energy conversion apparatus, thus produced, in which a polycrystalline impurity doped semiconductor layer is formed on the upper surface of the optically active layer, it is possible to improve the conversion efficiency.

The invention claimed is:

1. An optical energy conversion apparatus comprising:
    a substrate;
    an adhesive layer coated on said substrate;
    a barrier layer formed on said adhesive layer;
    a first electrode layer formed on said barrier layer;
    a reflecting film form on said first electrode layer;
    a first impurity doped semiconductor layer, formed on said reflecting film, said first impurity doped semiconductor layer being of a semiconductor material admixed with a first impurity;
    an optically active layer, formed on said first impurity doped semiconductor layer, said optically active semiconductor layer being of a hydrogen-containing amorphous semiconductor material;
    a second impurity doped semiconductor layer, admixed with a second impurity and formed on said optically active semiconductor layer, said second impurity doped semiconductor layer being of a polycrystallized semiconductor material lower in hydrogen concentration than the material of said optically active semiconductor layer; and
    a second electrode layer provided on said second impurity doped semiconductor layer; wherein
    the average crystal grain size of said second impurity doped semiconductor layer is decreased stepwise in a direction proceeding from the surface of the second impurity doped semiconductor layer towards said substrate.

2. The optical energy conversion apparatus according to claim 1 wherein said first impurity doped semiconductor layer, said optically active layer and said second impurity doped semiconductor layer are of a silicon-based semiconductor material.

3. The optical energy conversion apparatus according to claim 2 wherein the average hydrogen concentration of said optically active layer is not less than $5 \times 10^{20}$ atom/cc.

4. The optical energy conversion apparatus according to claim 2 wherein the average hydrogen concentration of said optically active layer is not less than $5 \times 10^{21}$ atom/cc.

5. The optical energy conversion apparatus according to claim 2 wherein the average doping efficiency of said second impurity in an area of said second impurity doped semiconductor layer with the average crystal grain size not less than 10 nm is approximately 100%.

6. The optical energy conversion apparatus according to claim 1 wherein the substrate is formed of a plastic material.

7. The optical energy conversion apparatus according to claim 1 wherein said first and second electrode layers are formed by transparent electrically conductive films and/or metal electrodes.

8. The optical energy conversion apparatus according to claim 7 wherein said transparent electrically conductive films are formed of ITO, tin oxide, fluorine-doped tin oxide, zinc oxide or zinc oxide-aluminum oxide.

9. The optical energy conversion apparatus according to claim 7 wherein said metal electrodes are formed of Ag, Cr, Mo, Ta or Al.

10. The optical energy conversion apparatus according to claim 1 wherein said adhesive layer comprises acrylic resin.

11. The optical energy conversion apparatus according to claim 1 wherein, in case light having a wavelength of 200 nm is incident on said second impurity doped semiconductor layer, a reflectance amounts to 50% or higher.

12. The optical energy conversion apparatus according to claim 1 wherein said first impurity doped semiconductor layer or said second impurity doped semiconductor layer is formed is SiC.

13. The optical energy conversion apparatus according to claim 1, wherein the substrate comprises PET.

14. The optical energy conversion apparatus according to claim 1, wherein said barrier layer comprises $SiO_2$.

15. The optical energy conversion apparatus according to claim 1, wherein said reflecting film comprises ITO.

* * * * *